US009755120B2

(12) United States Patent
Thompson et al.

(10) Patent No.: US 9,755,120 B2
(45) Date of Patent: Sep. 5, 2017

(54) LED DEVICE HAVING A DOME LENS

(75) Inventors: D. Scott Thompson, Woodbury, MN (US); Fedja Kecman, St. Louis Park, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/482,676

(22) Filed: May 29, 2012

(65) Prior Publication Data

US 2012/0235200 A1 Sep. 20, 2012

Related U.S. Application Data

(62) Division of application No. 11/851,604, filed on Sep. 7, 2007, now abandoned.

(51) Int. Cl.
*H01L 33/00* (2010.01)
*H01L 33/54* (2010.01)
*H01L 33/56* (2010.01)

(52) U.S. Cl.
CPC .............. *H01L 33/54* (2013.01); *H01L 33/56* (2013.01); *H01L 2224/48091* (2013.01)

(58) Field of Classification Search
CPC ..................... H01L 33/54; H01L 33/56; H01L 2224/49091; H01L 2924/00014; H01L 33/52; H01L 33/58; H01L 33/60; H01L 31/0203; H01L 31/0216; H01L 31/0232; H01L 33/486; H01L 33/483; H01L 2924/12041; H01L 2924/181
USPC ............ 257/79, 81, 95, 98, 100; 438/22–29
See application file for complete search history.

(56) References Cited

U.S. PATENT DOCUMENTS

| | | |
|---|---|---|
| 4,435,259 A | 3/1984 | Chang |
| 4,585,669 A | 4/1986 | Eckberg |
| 4,587,137 A | 5/1986 | Eckberg |
| 4,740,259 A | 4/1988 | Heinen |
| 4,822,536 A | 4/1989 | Voinis |
| 5,063,102 A | 11/1991 | Lee |
| 5,179,134 A | 1/1993 | Chu |
| 5,213,864 A | 5/1993 | Wong |
| 5,310,581 A | 5/1994 | Schmidt |
| 5,313,365 A | 5/1994 | Pennisi |
| 5,403,773 A | 4/1995 | Nitta et al. |
| 5,498,444 A | 3/1996 | Hayes |
| 5,525,564 A | 6/1996 | McAfee |
| 5,707,684 A | 1/1998 | Hayes |
| 5,895,228 A | 4/1999 | Biebuyck |
| 5,959,316 A | 9/1999 | Lowery |

(Continued)

FOREIGN PATENT DOCUMENTS

| | | |
|---|---|---|
| EP | 1 198 016 | 4/2002 |
| JP | 03-159033 A | 7/1991 |

(Continued)

*Primary Examiner* — Khiem D Nguyen
(74) *Attorney, Agent, or Firm* — Robert S. Moshrefzadeh

(57) ABSTRACT

A light emitting device comprises an LED die, a dome lens encapsulating the LED die, the dome lens having a first outer curved surface, and a photopolymerizable composition disposed on the dome lens. The photopolymerizable composition forms a meniscus lens defined by a second outer curved surface and an inner curved surface, the inner curved surface being in contact with only a portion of the first outer curved surface. The dome lens and the meniscus lens in combination form an elongated dome lens.

15 Claims, 15 Drawing Sheets

(56) References Cited

U.S. PATENT DOCUMENTS

| | | | |
|---|---|---|---|
| 6,066,861 A | 5/2000 | Höhn | |
| 6,274,890 B1 | 8/2001 | Oshio | |
| 6,367,949 B1 | 4/2002 | Pederson | |
| 6,489,637 B1* | 12/2002 | Sakamoto et al. | 257/98 |
| 6,576,488 B2 | 6/2003 | Collins, III | |
| 6,617,401 B2 | 9/2003 | Rubinsztajn | |
| 6,653,157 B2 | 11/2003 | Kondo | |
| 7,146,106 B2 | 12/2006 | Yang | |
| 7,192,795 B2 | 3/2007 | Boardman | |
| 7,314,770 B2 | 1/2008 | Boardman | |
| 7,344,902 B2* | 3/2008 | Basin | H01L 24/97 257/E33.059 |
| 7,655,486 B2 | 2/2010 | Thompson | |
| 2001/0042865 A1 | 11/2001 | Oshio | |
| 2002/0105266 A1 | 8/2002 | Juestel | |
| 2003/0107316 A1 | 6/2003 | Murakami | |
| 2004/0036081 A1 | 2/2004 | Okazaki | |
| 2004/0053059 A1 | 3/2004 | Mistele | |
| 2004/0084681 A1 | 5/2004 | Roberts | |
| 2004/0178509 A1 | 9/2004 | Yoshino | |
| 2004/0232825 A1* | 11/2004 | Sorg | H01L 33/486 313/501 |
| 2005/0072981 A1 | 4/2005 | Suenaga | |
| 2005/0221519 A1 | 10/2005 | Leung | |
| 2005/0244649 A1 | 11/2005 | Kashiwagi | |
| 2006/0035092 A1 | 2/2006 | Shimizu | |
| 2006/0105480 A1* | 5/2006 | Boardman | H01L 33/52 438/22 |
| 2006/0131124 A1 | 6/2006 | Chabinye | |
| 2006/0205237 A1 | 9/2006 | Kodama | |
| 2006/0226774 A1 | 10/2006 | Sofue | |
| 2007/0029569 A1* | 2/2007 | Andrews | H01L 33/52 257/99 |
| 2007/0092636 A1 | 4/2007 | Thompson | |
| 2007/0092736 A1 | 4/2007 | Boardman | |
| 2007/0092737 A1 | 4/2007 | Boardman | |
| 2007/0096129 A1* | 5/2007 | Park | B29C 39/025 257/98 |
| 2007/0096139 A1 | 5/2007 | Schultz | |
| 2007/0120135 A1* | 5/2007 | Soules | H01L 33/507 257/98 |
| 2007/0134425 A1 | 6/2007 | Morita | |
| 2007/0141739 A1 | 6/2007 | Thompson | |
| 2007/0246715 A1 | 10/2007 | Shin | |
| 2007/0269586 A1 | 11/2007 | Leatherdale | |
| 2007/0287208 A1 | 12/2007 | Thompson | |
| 2008/0023711 A1* | 1/2008 | Tarsa | H01L 33/486 257/98 |
| 2008/0026498 A1* | 1/2008 | Tarsa et al. | 438/26 |
| 2008/0079017 A1* | 4/2008 | Loh | H01L 33/58 257/98 |
| 2008/0079182 A1 | 4/2008 | Thompson | |

FOREIGN PATENT DOCUMENTS

| | | |
|---|---|---|
| JP | 2004-146554 A | 5/2004 |
| JP | 2005-020464 A | 1/2005 |
| WO | WO 99/19900 | 4/1999 |
| WO | WO 01/62400 | 8/2001 |
| WO | WO 2006/013066 | 2/2006 |

* cited by examiner

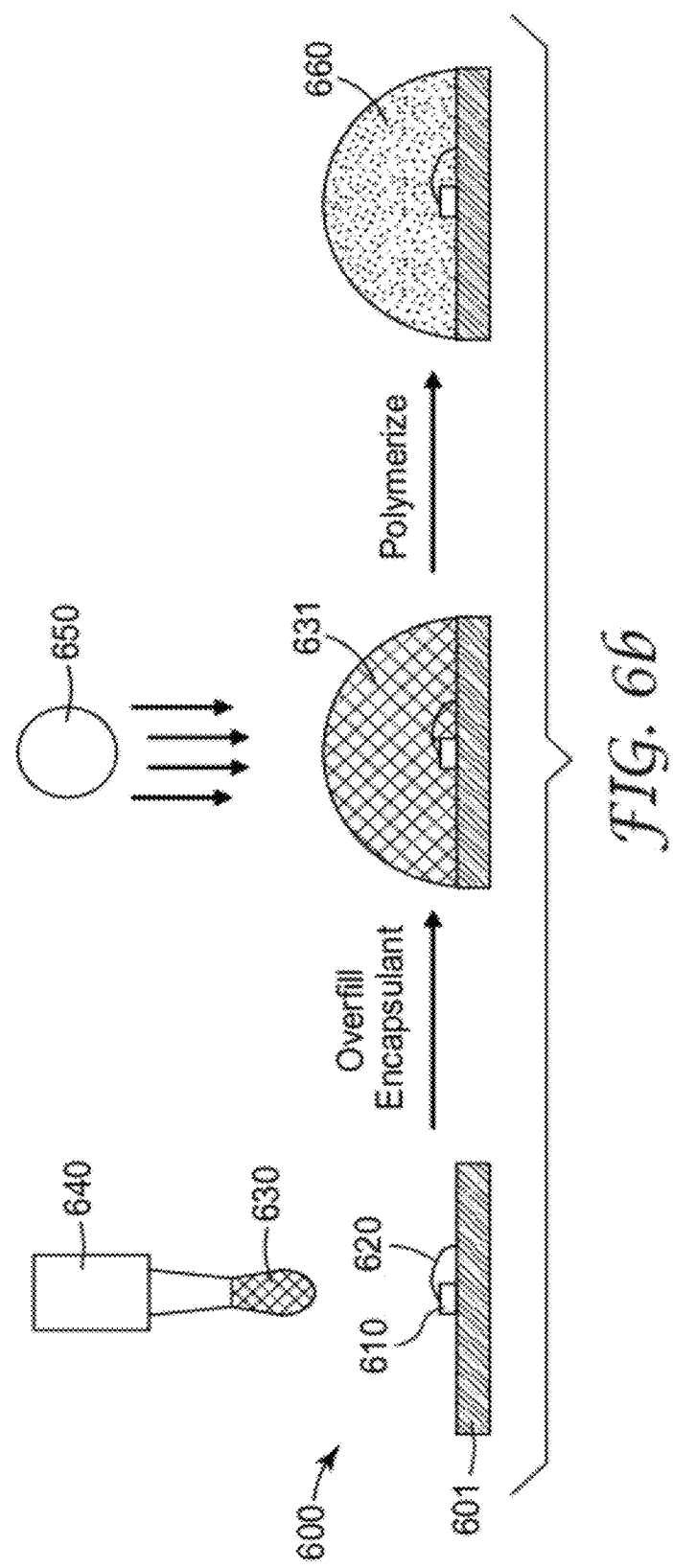

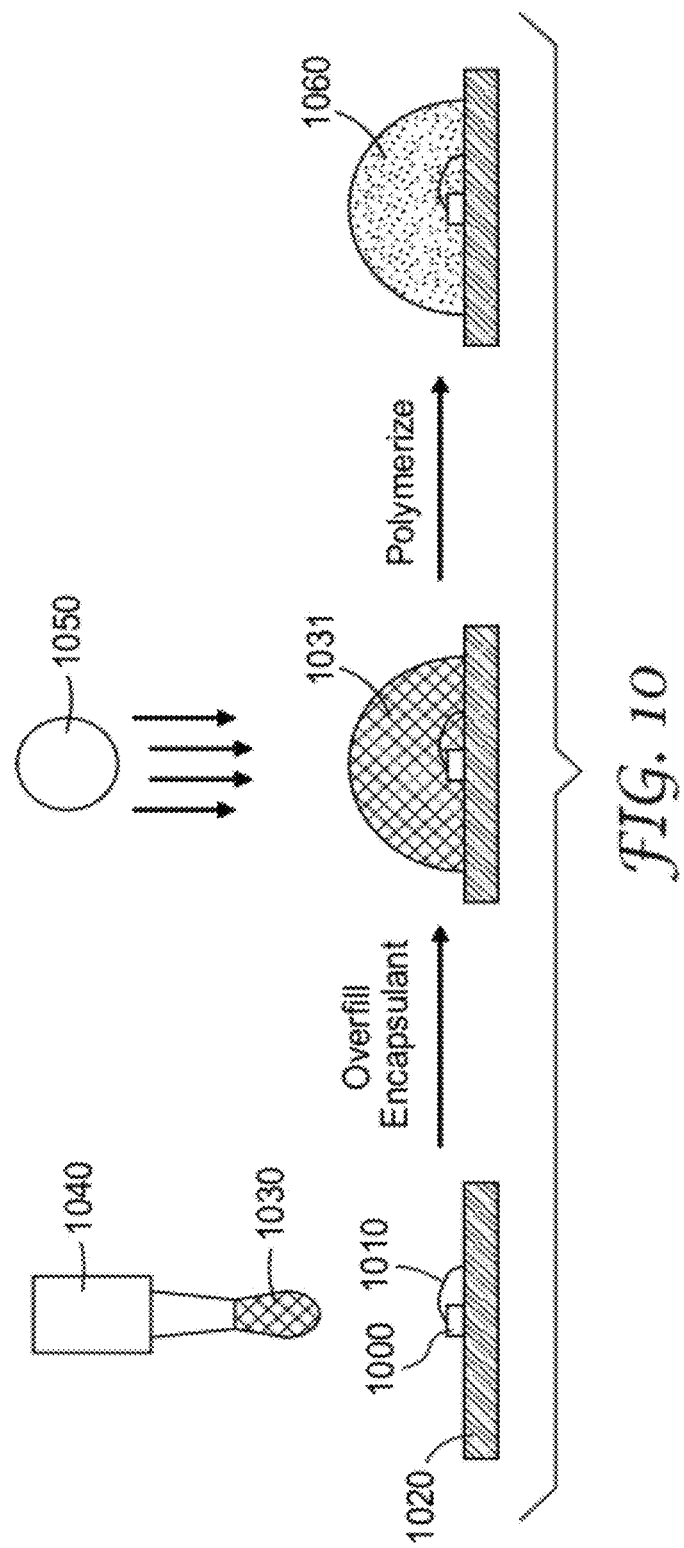

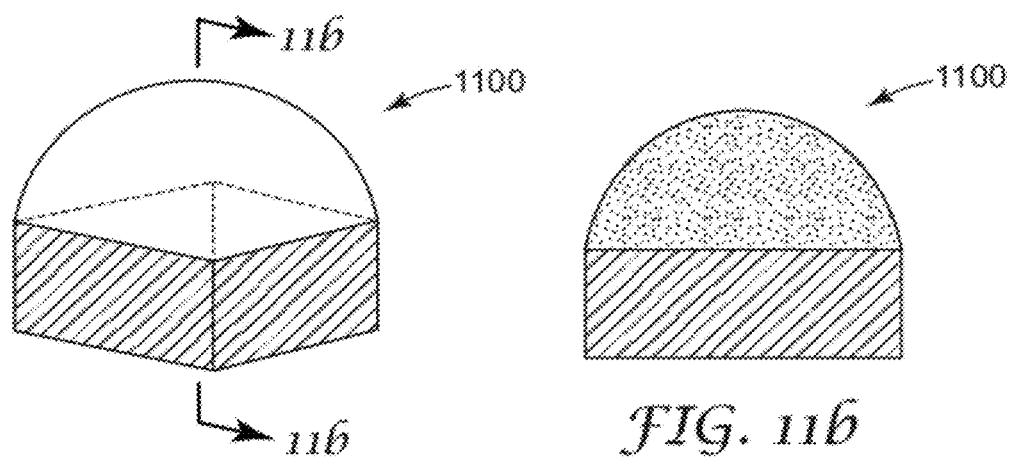
FIG. 11a
FIG. 11b
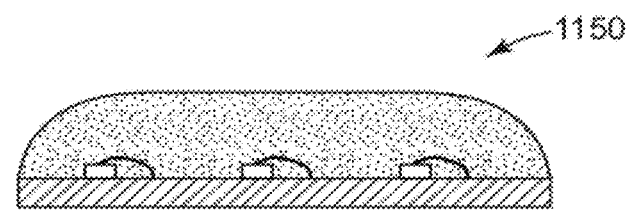
FIG. 11c
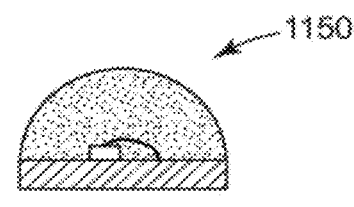
FIG. 11d

LED DEVICE HAVING A DOME LENS

CROSS-REFERENCE TO RELATED APPLICATION

This application is a continuation of U.S. Ser. No. 11/851,604, filed Sep. 7, 2007, abandoned, the disclosure of which is incorporated by reference in its entirety herein.

FIELD

This disclosure relates to a method of making a light emitting diode (led) device, and more particularly, to a method of forming a lens over an led die such that the two are optically coupled.

BACKGROUND

LED devices can be manufactured in a variety of configurations, many of which incorporate one or two conductive metal wires connecting a semiconductor or LED die to electrodes at the base of a substrate. Care must be exercised when handling the devices because bonding points of the wires to the electrodes and/or the LED die can easily be damaged. LED die are typically encapsulated with a transparent material or encapsulant which serves to protect the die and wire bonds from physical damage.

LED devices are typically characterized by performance characteristics such as brightness. With the proper selection of transparent material, an encapsulant can be used to increase brightness of an LED device by increasing the amount of light extracted from the LED die. Another way to increase brightness is to attach a lens having a curved outer surface to the LED die such that the two are optically coupled.

There is a need for new fast, efficient, and low cost methods for manufacturing LED devices having high brightness.

SUMMARY

A method of making a light emitting device is disclosed herein. In one aspect, the method comprises: providing an LED die and dispensing a photopolymerizable composition to form a photopolymerizable dome lens, wherein the photopolymerizable composition is optically coupled to the LED die. The photopolymerizable dome lens may be formed by the photopolymerizable composition using a single drop or a plurality of drops. In one embodiment, the photopolymerizable composition comprises a metal-containing catalyst and a silicon-containing resin comprising silicon-bonded hydrogen and aliphatic unsaturation.

In another aspect, the method comprises: providing an LED die and dispensing a photopolymerizable composition to form a photopolymerizable dome lens, wherein the photopolymerizable composition is optically coupled to the LED die, and the method further comprising applying actinic radiation having a wavelength of about 700 nm or less to initiate polymerization within the photopolymerizable composition. In one embodiment, the photopolymerized dome lens comprises an elastomer or a non-elastic solid.

In another aspect, a light emitting device is disclosed herein. The light emitting device may be prepared according to any of the methods disclosed herein. In one embodiment, the light emitting device comprises: an LED die disposed on an outer surface of a substrate, and a dome lens comprising a base, the base having the same shape as the outer surface of the substrate, wherein the LED die and the dome lens are optically coupled. Additional embodiments include dome lenses having a square base or a rectangular base.

These and other aspects of the invention are described in the detailed description below. In no event should the above summary be construed as a limitation on the claimed subject matter which is defined solely by the claims as set forth herein.

BRIEF DESCRIPTION OF DRAWINGS

The invention may be more completely understood in consideration of the detailed description in connection with the following figures:

FIGS. 6a-10 are schematic flow diagrams illustrating exemplary methods of making LED devices according to embodiments of the present disclosure.

FIGS. 11a-d are schematic diagrams of exemplary LED devices according to embodiments of the present disclosure.

DETAILED DESCRIPTION

Figure 1:
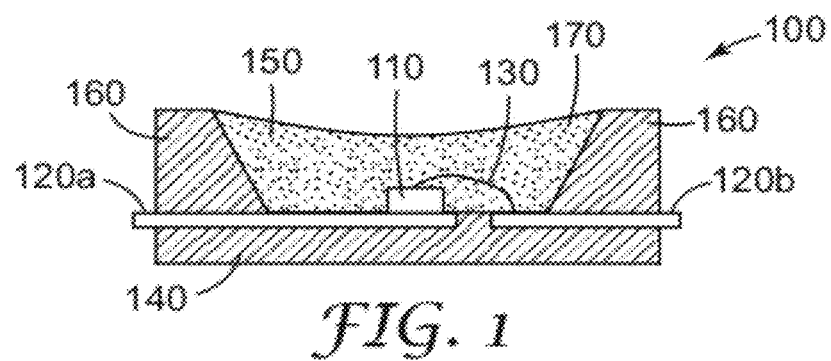
FIGS. 1, 2a, and 2b are schematic diagrams of known LED devices.

LED devices can be manufactured in a variety of configurations, many of which incorporate one or two conductive metal wires connecting the semiconductor die to electrodes on a substrate. FIG. 1 is a schematic diagram of a typical surface mount LED device 100. The LED die 110 is connected to electrode 120a and to electrode 120b by wire bond 130. The electrodes 120a and 120b are disposed on substrate 140, which together with sidewalls 160 form a reflecting cup. The LED die is encapsulated with encapsulant 150. The output surface 170 of the encapsulant has a slight negative meniscus or curvature, meaning the surface of the encapsulant is concave relative to the surface of the substrate. This negative meniscus is commonly seen in commercially available surface mount LED devices and can result from the use of a thermally cured encapsulant composition, for example, a thermally curable epoxy or silicone resin. The negative meniscus typically forms as a result of shrinkage of the encapsulant composition as it cools to room temperature from an elevated temperature used for curing. Temperatures used to cure thermally curable resins are often significantly higher than the temperatures that the encapsulant will experience when the LED device is in use, thus the negative meniscus will likely persist under normal operating temperatures. An LED device, such as that shown in FIG. 1, is undesirable because an output surface with a negative meniscus can lead to increased recycling of the light emitted by the LED die, which can decrease the efficiency and total radiant flux or light output of the LED device. For example, the substrate, electrodes, LED die, and encapsulant often contain materials that can absorb some small fraction of the light generated by the LED die, especially blue and UV light. Increased recycling of the light emitted by the LED die in the LED package can lead to absorptive losses.

Figure 2A:
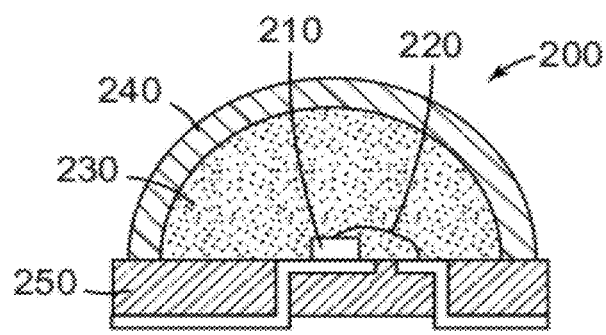
Figure 2B:
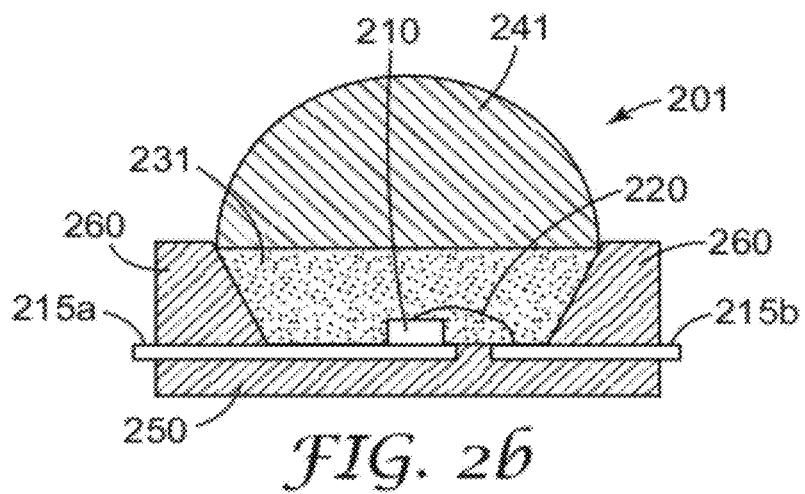

One way to improve the performance of an LED device is to provide a lens with a convex outer surface, for example a hemispherical lens. The lens with a convex outer surface helps to minimize light recycling in the packaged LED device. The types of LED devices that typically use lenses are high power, ultrahigh brightness LEDs. FIG. 2a show an example LED device 200 having an LED die 210 and wire bond 220 on a substrate 250. These types of LED devices can be constructed to provide a low stress environment for the LED die and wire bonds by encapsulation with a soft silicone gel 230 and covering the soft silicone gel with a suitably shaped hard outer shell 240 that is formed in a separate injection or compression molding process. The external shell, shown as a hemispherical lens in FIG. 2, can be formed into other shapes to produce desired light emission distributions from the LED package, for example more collimated light emission. This external lens when produced in a separate molding process, however, adds cost and complexity to the packaging process because the lens must be attached to the LED package in a pick and place operation and is then filled with encapsulant using a syringe in a second step. Another example LED device 201 is shown in FIG. 2b. In this type of LED device, an LED die 210 with one wire bond 220 is disposed on a substrate 250 and connected to electrodes 215a and 215b with sidewalls 260. The reflecting cup which is formed by the sidewalls 260 and substrate 250 is filled with an encapsulant material 231 and the lens 241 is floated on the encapsulant surface. The encapsulant is polymerized, thus bonding the lens onto the LED device. Alternatively, the half ball lens 241 shown in FIG. 2b can be bonded to the surface of an already cured encapsulant using a liquid adhesive. Regardless of whether the lens is bonded during the curing of the encapsulant or whether it is bonded with a liquid adhesive, the application of the lens requires a pick and place operation and the assembly procedure requires careful manipulation of the LED device until the encapsulant or liquid adhesive has cured. In addition to the added complexity introduced when using separately molded lenses, most injection moldable plastics suitable for making hard lenses have refractive indexes significantly higher than those of the most photostable silicone materials (the refractive index of polydimethylsiloxane is approximately 1.4). As a result, the package lifetime stability must be traded against optical efficiency.

Because of the added cost and complexity of using separately molded lenses in making LED devices, the majority of high brightness LED devices are made in formats that do not use lenses to increase light emission or to control the emission distribution of the LED device. The method disclosed herein provides numerous advantages. The method can be used to manufacture an LED device using a photopolymerizable composition to both encapsulate an LED die and provide an output surface that is optically coupled to the die such that lifetime, efficiency, and light output of the device are improved. With an appropriate combination of photopolymerizable composition and polymerization conditions, both encapsulation and formation of the output surface can be carried out in a single set of steps comprising a dispense step and a polymerization step. Thus, separate steps for encapsulation and attachment of a separately molded lens, are not required. In addition, the method can be used to manufacture LED devices wherein the emission distribution can be modified, for example to increase collimation of the light emitted by the LED device. Another advantage is that the addition of the dome lens can be done in a post-manufacturing operation.

The LED industry generally separates LEDs into three segments of LED performance. The lowest performing LEDs, for example LEDs used for indicator lamps, are low power devices and have total radiant output measured in millicandellas. The low performing LEDs generally are encapsulated with epoxy materials. The second segment of LEDs are called high brightness LEDs and have total radiant output measured in the range of 1-10 lumens. Currently, there are very few commercially available LEDs with lenses in the high brightness segment because the cost of the lens is a significant percentage of the total LED cost, for example high quality silicone lenses can cost from about 6 cents to about 20 cents per lens. The third segment of LEDs are called ultrahigh brightness LEDs and have total radiant output measured from about 10-100 lumens and greater. Because these devices are more expensive many of the LEDs in this segment have lenses as the lens accounts for a smaller percentage of the total cost of the LED device. The method described herein provides a means for making LED devices having lenses with little additional cost. The photopolymerizable compositions used with the method described herein can be rapidly polymerized such that formation of the LED device with a lens is fast and economical.

The method disclosed herein comprises: providing an LED die disposed on a substrate and dispensing a photopolymerizable composition to form a photopolymerizable dome lens, wherein the photopolymerizable composition is optically coupled to the LED die. The method involves the direct formation of a photopolymerizable composition or dome lens over an LED die mounted on a substrate. The substrate for the LED die, or LED dice, can be a flat substrate with electrodes. Alternatively, the substrate can comprise sidewalls that form a reflecting cup as shown in FIG. 1. The substrate can comprise ceramic, polymer, glass, metal, or a combination thereof. The sidewalls can comprise the same material or a different material from the substrate. For example, the substrate and sidewalls can both comprise ceramic or they can both comprise polymer. The photopolymerizable composition or dome lens can be formed directly on, and in contact with, the LED die or the photopolymerizable composition or dome lens can be formed on the surface of another encapsulant that is in contact with and encapsulating LED die. The method includes dispensing one or more droplets of a photopolymerizable composition to form a photopolymerizable dome over an LED die which may or may not be encapsulated. Actinic radiation having a wavelength of 700 nm or less can then be used to at least partially polymerize the photopolymerizable composition or dome lens such that the photopolymerizable composition has reached its gel point and no longer flows (the shape of the dome lens is set).

The design and shape of the substrate and/or the optional sidewalls may determine the optimal geometry of the dome lens and positioning of the LED die relative to the output surface of the dome lens. In general, these factors are optimized to achieve the maximum increase in efficiency for the LED device. For some cases though the increase may be less than the maximum, for example when a dome lens is used to change the emission distribution of the LED device, for example when making a collimating LED device. In general, to achieve near maximum efficiency, it is desirable for the LED die to be roughly at, or near, the center of the radius of curvature of the output surface of the dome lens so that significant increases in LED efficiency can be obtained.

Figure 3A:
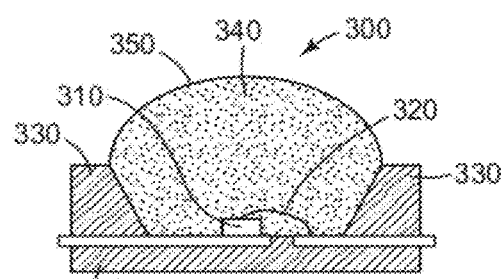
FIGS. 3a, 3b, 3c and 4 are schematic diagrams of exemplary LED devices according to embodiments of the present disclosure.
Figure 3B:
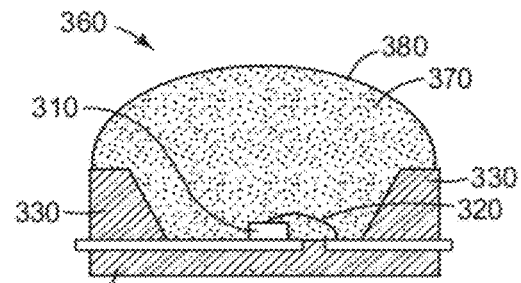

FIGS. 3a and 3b show schematic diagrams of two exemplary LED devices that can be formed using the method described herein. In FIG. 3a, LED device 300 comprises LED die 310 and wire bond 320 disposed in a reflector cup formed by sidewalls 330 and substrate 355. Dome lens 340 encapsulates the LED die and has a convex outer surface or output surface 350. The diameter of the dome lens (the widest part of the lens, typically the base of the lens) is about the same as the diameter of the opening of the reflector cup. In FIG. 3b, LED device 360 comprises LED die 310 and wire bond 320 disposed in a reflector cup formed by sidewalls 330 and substrate 355. Dome lens 370 encapsulates the LED die and has a convex outer surface or output surface 380. In this case, the diameter of the dome is about the same as the diameter of the reflector cup, including not just the opening, but also the outer perimeter of the cup.

Both of these lens types can be made using the method described herein by proper modification of the rheological properties of the photopolymerizable composition and or modification of the process variables such as the intensity of light used for polymerizing the composition. The choice of lens shape and diameter of the lens, as described in FIGS. 3a and 3b may be dependent on the design of LED device. It may be necessary to take into account the depth of the reflecting cup in which the LED die is mounted and/or the angle and shape of the sidewalls of the reflecting cup. When the LED die is mounted in a reflecting cup it may be desirable to place the LED roughly at the center of the radius of curvature of output surface of the dome lens. This generally results in significant increases in LED efficiency.

Figure 3C:
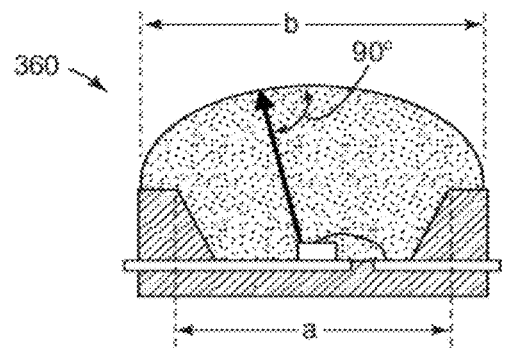

FIG. 3c shows an LED device with a dome lens. Widths a and b are shown in the figure. The width of the opening at the top of the reflecting cup is defined as a and the width of the dome lens where it meets the top surface of the reflecting cup, is defined as b. In general, the ratio of the widths of b/a is greater than or equal to 1.0, greater than 1.2, greater than 1.5, or even greater than 2.0. For certain LED devices, making the width of the dome lens where it meets the top surface of the reflecting cup significantly larger than the width of the opening at the top of the reflecting cup may help to increase the efficiency of the LED device by minimizing Fresnel reflections at the output surface of the dome lens.

Figure 4:
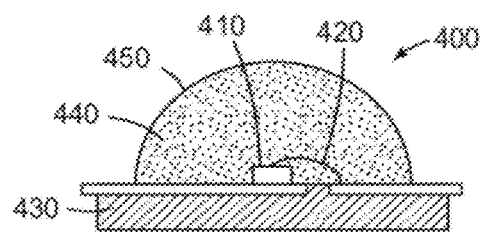

FIG. 4 shows a schematic diagram of another exemplary LED device that can be formed using the method described herein. In FIG. 4, LED device 400 comprises LED die 410 and wire bond 420 disposed on a substrate 430 with electrodes. Dome lens 440 encapsulates the LED die and has a convex outer surface 450. The diameter of the dome lens can be varied by changing the relative dimensions, shape and material of the substrate 430. For example, if the shape of the substrate is a square, the shape of the base of the dome lens may correspond to the shape of the substrate as shown later in FIG. 11a and 11b. The height of the dome may depend on the rheological properties of the photopolymerizable composition used to make the dome lens as well as the relative dimensions, shape, and composition of the material of substrate 430. For an LED die mounted on a substrate having no sidewalls the most beneficial lens is one that in cross section has a hemispherical or near hemispherical shape, which places the LED die at or near the center of the radius of curvature of the surface of the lens.

Any photopolymerizable composition may be used for the method disclosed herein as long as it provides the following needs. For one, the photopolymerizable composition is dispensible using a suitable dispensing device, such as any of those described below. The photopolymerizable composition also has properties that allow it to form a dome lens having a desired shape and geometry, and the dome lens can retain this shape for a time long enough to at least partially cure or polymerize the photopolymerizable composition. The photopolymerizable composition when polymerized needs to form a polymer with certain beneficial characteristics. For example, the polymer may need to be soft enough such that stress on the die and wire bond(s) is minimized during thermal cycling of the device when in use. Also, the polymer may need to be thermally and photochemically stable enough so that it exhibits little or no yellowing over time.

Desirable properties of the photopolymerizable composition include relatively low viscosity, such that it can be easily and quickly dispensed. Another desirable property of the photopolymerizable composition is that it has the ability to form and hold a dome shape for a period of time that is preferably greater than 30 seconds, more preferably greater than 1 minute and even more preferably greater than 5 minutes. It is also desirable that the photopolymerizable composition polymerize quickly when irradiated with actinic radiation so that the photopolymerizable composition reaches its gel point and can set or lock in the dome lens shape that was formed on dispensing. The photopolymerizable composition can have a viscosity of from about 100 to about 15000 cP at 25 degrees Celsius. The polymerizable composition may be thixotropic or shear thinning, but for most cases, it is preferred that the photopolymerizable composition be a near Newtonion fluid to increase the speed of dispensing for improved manufacturing productivity. Preferably the viscosity is less than about 10,000 cP at 25 degrees Celsius, more preferably the viscosity is less than about 5,000 cP at 25 degrees Celsius. The time needed to polymerize the photopolymerizable composition to a gel under the influence of actinic radiation is preferably less than 5 minutes, more preferably less than 2 minutes, even more preferably less than 1 minute, and most preferably from 1-10 seconds. In some embodiments, it may be desirable that the time needed to polymerize the photopolymerizable dome lens to its gel point is shorter than the time that it takes for the dome lens to flow over the edges of the substrate or in the case where the substrate has sidewalls over the edge at the top of the sidewalls.

In one preferred embodiment, the photopolymerizable composition comprises a metal-containing catalyst and a silicon-containing resin comprising silicon-bonded hydrogen and aliphatic unsaturation. Such photopolymerizable compositions are described in U.S. Pat. No. 7,192,795 (Boardman et al.), U.S. Pat. No. 7,314,770 (Boardman et al.); U.S. Publ. No. 2007/0092736 A1 (Boardman et al.); U.S. Publ. No. 2007/0092737 A1 (Boardman et al.); and U.S. Pat. No. 7,655,486 (Thompson et al.). The silicon-containing resin can comprise an organosiloxane (i.e., silicones) which includes organopolysiloxanes and are polymerized by metal-catalyzed hydrosilylation reactions between groups incorporating aliphatic unsaturation and silicon-bonded hydrogen, which are bonded to the organosiloxane components. The silicon-containing resin can include monomers, oligomers, polymers, or mixtures thereof. It includes silicon-bonded hydrogen and aliphatic unsaturation, which allows for hydrosilylation (i.e., the addition of a silicon-bonded hydrogen across a carbon-carbon double bond or triple bond). The silicon-bonded hydrogen and the aliphatic unsaturation may or may not be present in the same molecule. Furthermore, the aliphatic unsaturation may or may not be directly bonded to silicon.

Preferred silicon-containing resins are those that can provide a polymerized dome lens which can be in the form of an elastomer, or non-elastic solid, and is thermally and photochemically stable. For UV light, silicon-containing resins having refractive indices of at least 1.34 are preferred. For some embodiments, silicon-containing resins having refractive indices of at least 1.50 may be preferred.

Preferred silicon-containing resins are selected such that they provide an encapsulant and polymerized dome lens that is photostable and thermally stable. Herein, photostable refers to a material that does not chemically degrade upon prolonged exposure to actinic radiation, particularly with respect to the formation of colored or light absorbing degradation products. Herein, thermally stable refers to a material that does not chemically degrade upon prolonged exposure to heat, particularly with respect to the formation of colored or light absorbing degradation products. In addition, preferred silicon-containing resins are those that possess relatively short polymerization times (e.g., seconds to less than 30 minutes) in order to accelerate manufacturing times and reduce overall LED cost.

Examples of suitable silicon-containing resins are disclosed, for example, in U.S. Pat. Nos. 6,376,569 (Oxman et al.), 4,916,169 (Boardman et al.), 6,046,250 (Boardman et al.), 5,145,886 (Oxman et al.), 6,150,546 (Butts), and in U.S. Pat. Publ. No. 2004/0116640 (Miyoshi). A preferred silicon-containing resin comprises an organosiloxane (i.e., silicones) which includes organopolysiloxanes. Such resins typically include at least two components, one having silicon-bonded hydrogen and one having aliphatic unsaturation. However, both silicon-bonded hydrogen and olefinic unsaturation may exist within the same molecule.

In one embodiment, the silicon-containing resin can include a silicone component having at least two sites of aliphatic unsaturation (e.g., alkenyl or alkynyl groups) bonded to silicon atoms in a molecule and an organohydrogensilane and/or organohydrogenpolysiloxane component having at least two hydrogen atoms bonded to silicon atoms in a molecule. Preferably, a silicon-containing resin includes both components, with the silicone containing aliphatic unsaturation as the base polymer (i.e., the major organosiloxane component in the composition.) Preferred silicon-containing resins are organopolysiloxanes. Such resins typically comprise at least two components, at least one of which contains aliphatic unsaturation and at least one of which contains silicon-bonded hydrogen. Such organopolysiloxanes are known in the art and are disclosed in such patents as U.S. Pat. No. 3,159,662 (Ashby), U.S. Pat. No. 3,220,972 (Lamoreaux), U.S. Pat. No. 3,410,886 (Joy), U.S. Pat. No. 4,609,574 (Keryk), U.S. Pat. No. 5,145,886 (Oxman, et. al), and U.S. Pat. No. 4,916,169 (Boardman et. al). Curable one component organopolysiloxane resins are possible if the single resin component contains both aliphatic unsaturation and silicon-bonded hydrogen.

Organopolysiloxanes that contain aliphatic unsaturation are preferably linear, cyclic, or branched organopolysiloxanes comprising units of the formula $R^1_a R^2_b SiO_{(4-a-b)/2}$ wherein: $R^1$ is a monovalent, straight-chained, branched or cyclic, unsubstituted or substituted hydrocarbon group that is free of aliphatic unsaturation and has from 1 to 18 carbon atoms; $R^2$ is a monovalent hydrocarbon group having aliphatic unsaturation and from 2 to 10 carbon atoms; a is 0, 1, 2, or 3; b is 0, 1, 2, or 3; and the sum a+b is 0, 1, 2, or 3; with the proviso that there is on average at least 1 $R^2$ present per molecule. In one embodiment, at least 90 mole percent of the $R^1$ groups are methyl.

Organopolysiloxanes that contain aliphatic unsaturation preferably have an average viscosity of at least 5 mPa·s at 25° C.

Examples of suitable $R^1$ groups are alkyl groups such as methyl, ethyl, n-propyl, isopropyl, n-butyl, iso-butyl, tert-butyl, n-pentyl, iso-pentyl, neo-pentyl, tert-pentyl, cyclopentyl, n-hexyl, cyclohexyl, n-octyl, 2,2,4-trimethylpentyl, n-decyl, n-dodecyl, and n-octadecyl; aromatic groups such as phenyl or naphthyl; alkaryl groups such as 4-tolyl; aralkyl groups such as benzyl, 1-phenylethyl, and 2-phenylethyl; and substituted alkyl groups such as 3,3,3-trifluoro-n-propyl, 1,1,2,2-tetrahydroperfluoro-n-hexyl, and 3-chloro-n-propyl.

Examples of suitable $R^2$ groups are alkenyl groups such as vinyl, 5-hexenyl, 1-propenyl, allyl, 3-butenyl, 4-pentenyl, 7-octenyl, and 9-decenyl; and alkynyl groups such as ethynyl, propargyl and 1-propynyl. In the present invention, groups having aliphatic carbon-carbon multiple bonds include groups having cycloaliphatic carbon-carbon multiple bonds.

Organopolysiloxanes that contain silicon-bonded hydrogen are preferably linear, cyclic or branched organopolysiloxanes comprising units of the formula $R^1_a H_c SiO_{(4-a-c)/2}$ wherein: $R^1$ is as defined above; a is 0, 1, 2, or 3; c is 0, 1, or 2; and the sum of a+c is 0, 1, 2, or 3; with the proviso that there is on average at least 1 silicon-bonded hydrogen atom present per molecule. In one embodiment, at least 90 mole percent of the $R^1$ groups are methyl.

Organopolysiloxanes that contain silicon-bonded hydrogen preferably have an average viscosity of at least 5 mPa·s at 25° C.

Organopolysiloxanes that contain both aliphatic unsaturation and silicon-bonded hydrogen preferably comprise units of both formulae $R^1_a R^2_b SiO_{(4-a-b)/2}$ and $R^1_a H_c SiO_{(4-a-c)/2}$. In these formulae, $R^1$, $R^2$, a, b, and c are as defined above, with the proviso that there is an average of at least 1 group containing aliphatic unsaturation and 1 silicon-bonded hydrogen atom per molecule.

The molar ratio of silicon-bonded hydrogen atoms to aliphatic unsaturation in the silicon-containing resin (particularly the organopolysiloxane resin) may range from 0.5 to 10.0 mol/mol, preferably from 0.8 to 4.0 mol/mol, and more preferably from 1.0 to 3.0 mol/mol.

For some embodiments, organopolysiloxane resins described above wherein a significant fraction of the $R^1$ groups are phenyl or other aryl, aralkyl, or alkaryl are preferred, because the incorporation of these groups provides materials having higher refractive indices than materials wherein all of the $R^1$ radicals are, for example, methyl. In one embodiment, at least 90 mole percent of the $R^1$ groups are methyl.

The disclosed compositions also include a metal-containing catalyst which enables the polymerization of the encapsulating material via radiation-activated hydrosilylation. These catalysts are known in the art and typically include complexes of precious metals such as platinum, rhodium, iridium, cobalt, nickel, and palladium. The precious metal-containing catalyst preferably contains platinum. Disclosed compositions can also include a cocatalyst.

A variety of such catalysts is disclosed, for example, in U.S. Pat. No. 6,376,569 (Oxman et al.), U.S. Pat. No. 4,916,169 (Boardman et al.), U.S. Pat. No. 6,046,250

(Boardman et al.), U.S. Pat. No. 5,145,886 (Oxman et al.), U.S. Pat. No. 6,150,546 (Butts), U.S. Pat. No. 4,530,879 (Drahnak), U.S. Pat. No. 4,510,094 (Drahnak) U.S. Pat. No. 5,496,961 (Dauth), U.S. Pat. No. 5,523,436 (Dauth), U.S. Pat. No. 4,670,531 (Eckberg), as well as International Publ. No. WO 95/025735 (Mignani).

Certain preferred platinum-containing catalysts are selected from the group consisting of Pt(II) β-diketonate complexes (such as those disclosed in U.S. Pat. No. 5,145,886 (Oxman et al.), ($\eta^5$-cyclopentadienyl)tri(σ-aliphatic) platinum complexes (such as those disclosed in U.S. Pat. No. 4,916,169 (Boardman et al.) and U.S. Pat. No. 4,510,094 (Drahnak)), and $C_{7\text{-}20\text{-}}$ aromatic substituted ($\eta^5$-cyclopentadienyl)tri(σ-aliphatic)platinum complexes (such as those disclosed in U.S. Pat. No. 6,150,546 (Butts).

Such catalysts are used in an amount effective to accelerate the hydrosilylation reaction. Such catalysts are preferably included in the encapsulating material in an amount of at least 1 part, and more preferably at least 5 parts, per one million parts of the encapsulating material composition. Such catalysts are preferably included in the encapsulating material in an amount of no greater than 1000 parts of metal, and more preferably no greater than 200 parts of metal, per one million parts of the encapsulating material composition.

The photopolymerizable composition is one in which polymerization is initiated by exposure to actinic radiation. Other useful photopolymerizable compositions include epoxy and acrylate compositions.

In addition to the silicon-containing resins and catalysts, the encapsulating material can also include nonabsorbing metal oxide particles, semiconductor particles, phosphors, sensitizers, photoinitiators, antioxidants, catalyst inhibitors, adhesion promoters, and pigments. If used, such additives are used in amounts to produce the desired effect.

The photopolymerizable composition can be dispensed in a number of ways. A syringe may be used, either manually controlled or with an automated dispensing system; examples of the latter include an air driven dispensing system such as the Ultra 2400 Series Dispensing Workstation, and a positive displacement dispensing system such as the Ultra 2800 Dispensing System (both available from EFD Inc., East Providence, R.I. 02914). Drop size can be controlled by choice of the dispensing tip, which can have sizes between 12 and 27 gauge. The photopolymerizable composition can also be dispensed using a computer controlled jet dispensing system such as a system fitted with the DJ-9000 DispenseJet Valve (available from Asymtek Inc., Carlsbad, Calif.). Jet dispensing systems can jet up to 200 small droplets or shots of material every second with volumes as small as 1 nL. Jet dispensing systems can dispense up to 120 mg of material per second.

The method may further comprise applying actinic radiation having a wavelength of about 700 nm or less, preferably from about 250 nm to about 500 nm, to initiate polymerization within the photopolymerizable composition. If the photopolymerizable composition comprises a silicon-containing resin comprising silicon-bonded hydrogen and aliphatic unsaturation, preferably the actinic radiation is from about 250 nm to about 500 nm, so that hydrosilylation within the silicon-containing resin is initiated. Sources of actinic radiation include tungsten halogen lamps, xenon arc lamps, mercury arc lamps, incandescent lamps, germicidal lamps, and fluorescent lamps. In one embodiment, the source of actinic radiation is the LED die.

There are a variety of possible UV sources that can be used to cure the silicon-containing material. One class is low intensity, low-pressure mercury bulbs. These include germicidal bulbs emitting primarily at 254 nm, Blacklight bulbs with peak emissions near 350 or 365 nm, and Blacklight Blue bulbs with emissions similar to Blacklight bulbs but using special glass to filter out light above 400 nm. Such systems are available from VWR, West Chester, Pa. Other classes include high intensity continuously emitting systems such as those available from Fusion UV Systems, Gaithersburg, Md.; high intensity pulsed emission systems such as those available from XENON Corporation Wilmington, Mass.; high intensity spot curing systems such as those available from LESCO Corporation Torrance, Calif.; and LED-based systems such as those available from UV Process Supply, Inc. Chicago, Ill. Laser systems may also be used for initiating polymerization in the photopolymerizable composition.

Figure 5A:
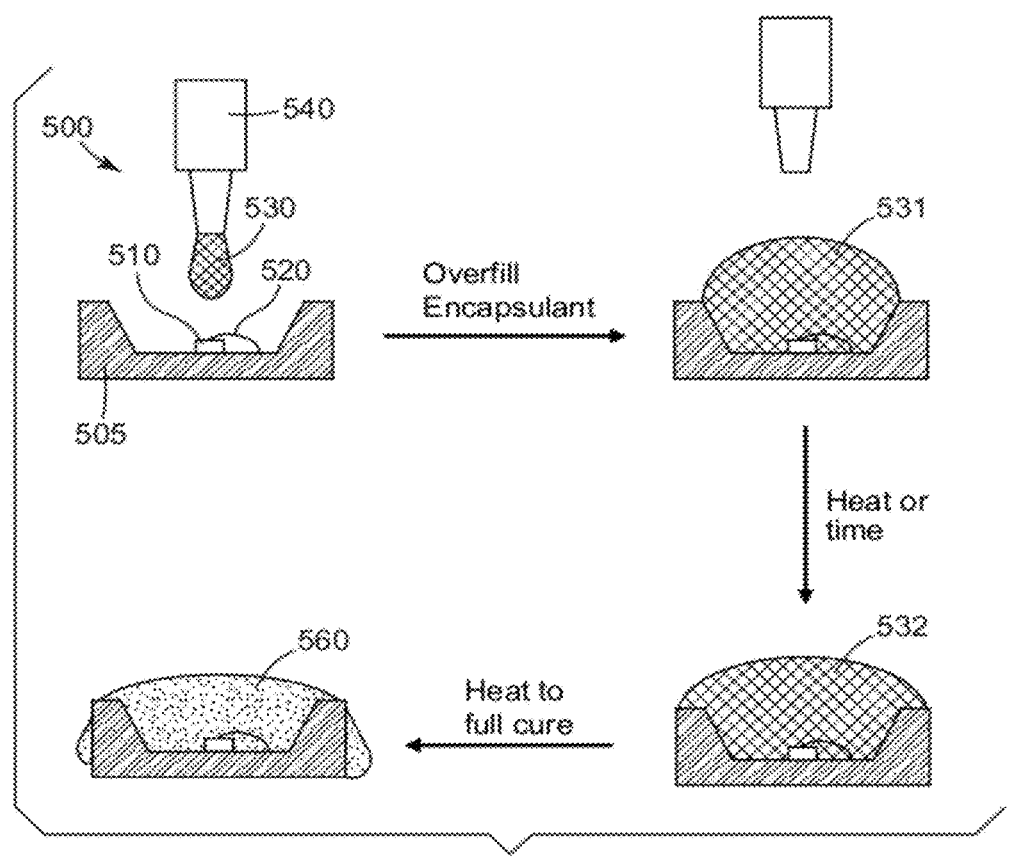
FIGS. 5a and 5b are schematic flow diagrams illustrating methods of making LED devices according to embodiments of the present disclosure.
Figure 5B:
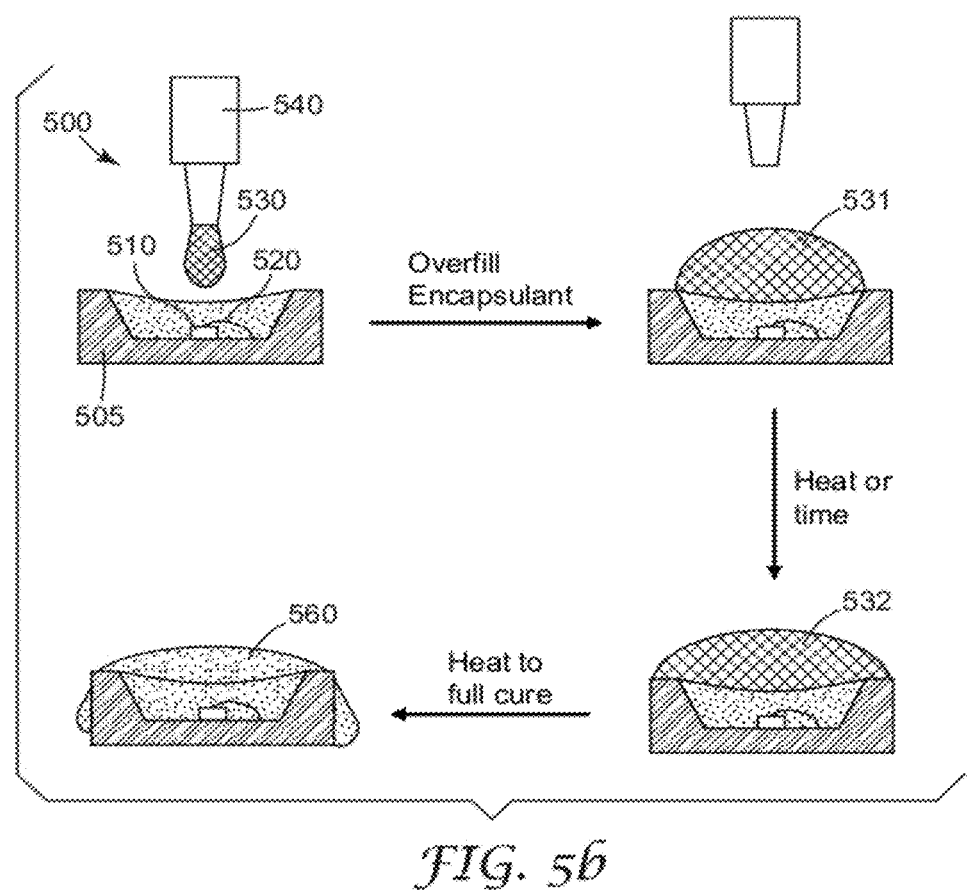

Methods for making LED devices with dome lenses are disclosed in the description of the following figures. FIGS. 5a and 5b illustrate the problems associated with the process for making LED devices with dome lenses using thermally polymerizable compositions. FIGS. 6a-10 disclose methods for making LED devices with dome lenses using photopolymerizable compositions. For the following descriptions the polymerizable and photopolymerizable compositions may be described using silicones or organopolysiloxanes. For the sake of clarity, the electrodes on the substrates have been omitted.

FIG. 5a shows a schematic flow diagram in cross section of a method used to make an LED device and illustrates problems associated with the use of thermally polymerizable compositions, for example thermally curable silicones. Into the reflecting cup 505 of an unencapsulated LED device 500 having LED die 510 and wire bond 520 is added thermally polymerizable silicone composition 530 from dispensing device 540. The reflecting cup is overfilled with the composition to make polymerizable dome lens 531. Thermally polymerizable silicones contain inhibitors to extend pot-life and to provide several hours of working time. Because of this, thermally curable silicones must be heated to initiate polymerization of the silicone, and if a fast polymerization is desired the temperature used to for polymerization must be very high, typically around 150° C. As the polymerizable composition is heated, its viscosity drops and flows to form shallow dome lens 532. As heating to full cure takes place, the polymerizable composition flows over the edges of the LED device prior to reaching the gel point, at which point the composition would set and no longer flow. An even shallower dome lens 560 is formed with excess polymerized encapsulant around the sides and bottom of the LED device. FIG. 5b shows a similar case where the thermally polymerizable composition is dispensed onto the surface of an already encapsulated LED to form a polymerizable dome lens. Again the silicone flows when heated and flows over the edge of the LED device.

The problem of heat induced flow of thermally polymerizable silicones on heating can be mediated somewhat by making the silicone resin thixotropic, but the problem is not solved completely, as the thixotropic silicone resin still has a tendency to slump during heating due to long polymerization times. Additionally, thixotropic materials are more difficult to degas because of the higher viscosity of the material and tend to be slower to dispense.

Figure 6A:
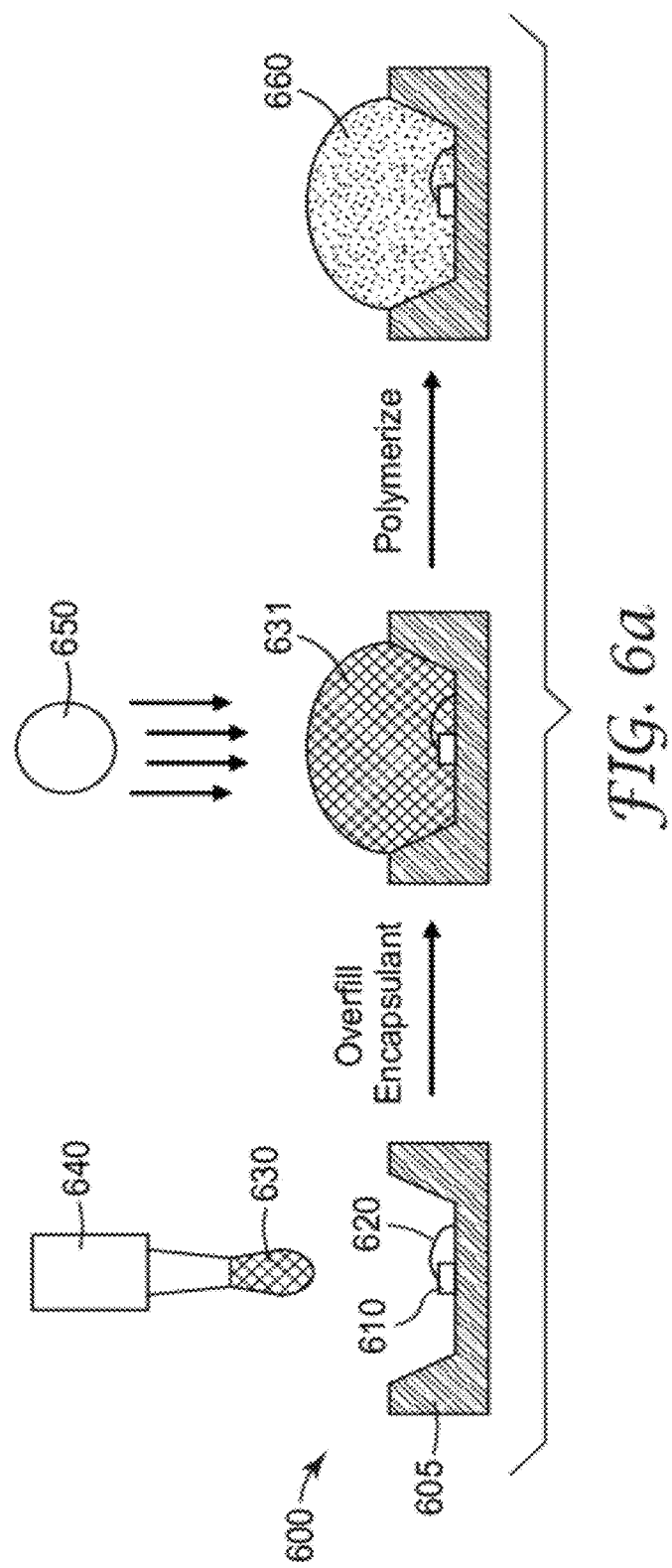

In order to make LED devices with dome lenses, where the dome lens is made by overfilling an unencapsulated LED device with an encapsulant composition, as shown in FIG. 5a or where a polymerizable composition is dispensed onto the surface of an already encapsulated LED device, as shown in FIG. 5b, the polymerizable composition is ideally polymerized to its gel point quickly and preferably at ambient temperature. FIG. 6a shows a schematic flow diagram in cross section of an exemplary method used to make an LED device according to the present disclosure. Into the reflecting cup 605 of an unencapsulated LED device 600 having LED die 610 and wire bond 620 is added photopolymerizable composition 630 from dispensing device 640. The reflecting cup is overfilled with the composition to make photopolymerizable dome lens 631. The composition is then irradiated with actinic radiation from light source 650 which initiates polymerization to form an at least partially polymerized dome lens 660 whereby the composition reaches its gel point and no longer flows. Wavelengths of light used to initiate polymerization in the photopolymerizable composition are commonly in the range from about 250 nm to about 500 nm. The gel point of the photopolymerizable composition is reached in a time span short enough to minimize the flow of the dome lens and mitigates the problems associated with the use of thermally-polymerized materials. Typical times required to at least partially polymerize and gel the photopolymerizable composition are ideally less than 10 minutes, less than 5 minutes, less than 1 minute, or from about 1 to about 10 seconds. FIG. 6b shows a similar schematic flow diagram in cross section of an exemplary method used to make an LED device where the LED device 600 does not have a reflecting cup. In this case the width of the dome corresponds to the width of the substrate of the LED device.

The photopolymerizable composition may be heated prior to dispensing in order to lower its viscosity and facilitate dispensing. In this case, however, care must be taken so that the viscosity is still sufficiently high enough such that the photopolymerizable composition does not flow outside of a particular diameter. Heat may also be applied during application of actinic radiation in order to facilitate polymerization; the temperature may be less than 100° C., more preferably, at a temperature of less than 60° C. Preferably the gel point of the photopolymerizable composition is reached with exposure to actinic radiation at ambient temperature. After the gel point has been reached, further actinic radiation and/or heat can be applied to further polymerize the composition. This step can be carried out in the same operation at the same station or at different stations. Alternatively, the additional actinic radiation and/or heat can be applied in a separate operation such as with a completely different radiation source.

Figure 7:
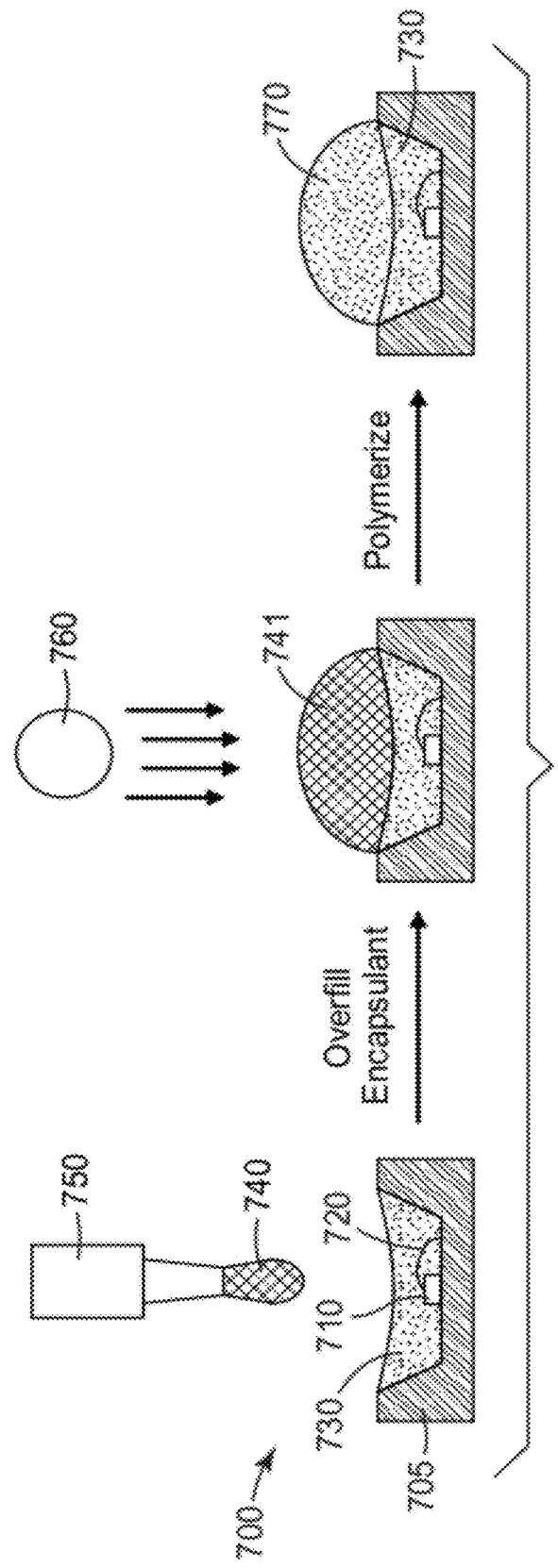

FIGS. 7-10 show schematic flow diagrams in cross section of exemplary methods used to make LED devices according to the present disclosure. In FIG. 7, the encapsulated LED device 700 contains LED die 710 and wire bond 720 which are encapsulated with encapsulant 730. To the surface of the encapsulant is added a volume of photopolymerizable composition 740 from dispensing device 750, for example from a syringe as previously described. The negative meniscus of the encapsulant is eliminated by overfilling with the photopolymerizable composition to form photopolymerizable dome lens 741. The photopolymerizable dome lens is then irradiated with actinic radiation from light source 760 which initiates polymerization and continues at least until the photopolymerizable composition forms a partially polymerized dome lens 770, wherein the photopolymerizable composition has reached its gel point and the shape of the dome lens is set and no longer flows. Ideally, the encapsulant and the dome lens are bonded together.

Figure 8:
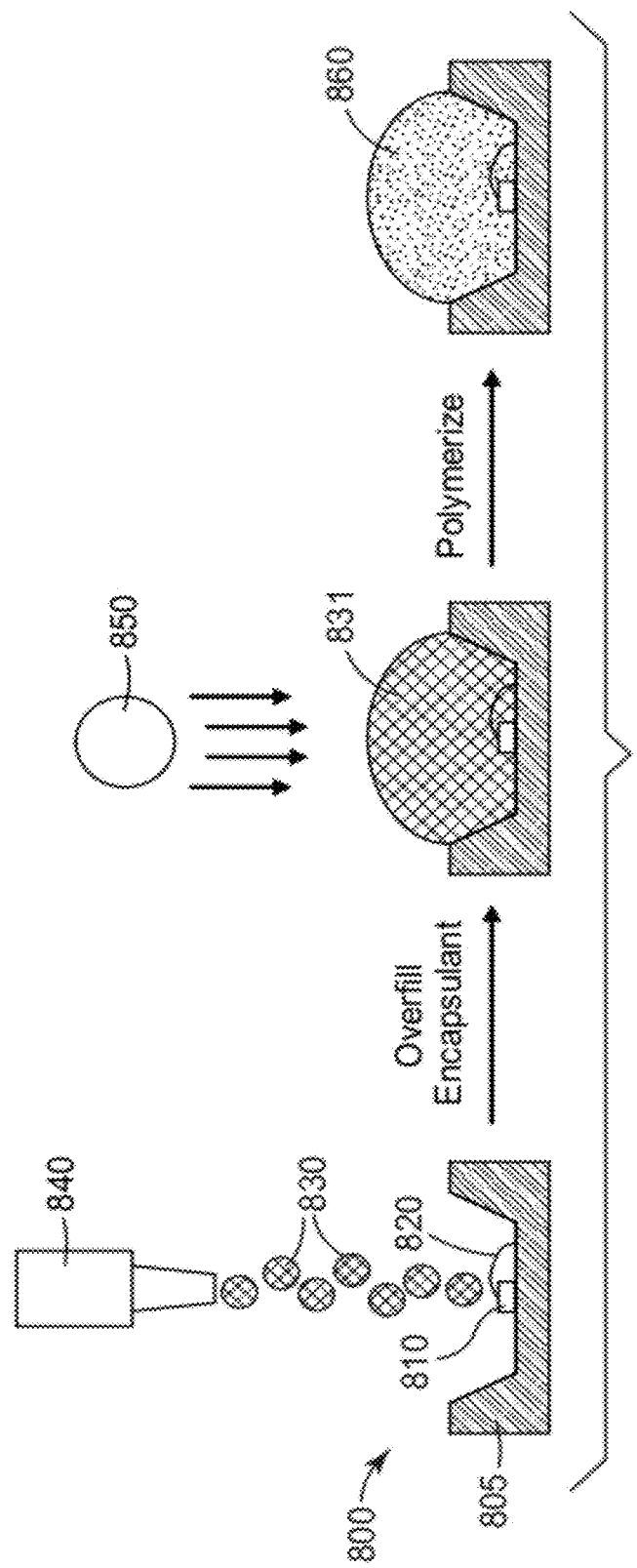

In FIG. 8, into unencapsulated LED device 800 having LED die 810 and wire bond 820 is added a plurality of drops of photopolymerizable composition 830 from dispensing device 840, for example from a jet dispensing system such as the one described previously. The reflecting cup 805 is overfilled with the photopolymerizable composition to make photopolymerizable dome lens 831. The composition is then irradiated with actinic radiation from light source 850 which initiates polymerization and continues at least until the photopolymerizable composition forms partially cured dome lens 860, wherein the photopolymerizable composition has reached its gel point and the shape of the dome lens is set and no longer flows. Because jet dispensing can deliver larger volumes of material faster than syringe dispensing, the method shown in FIG. 8 may be useful for devices which require large amounts of photopolymerizable compositions.

Figure 9:
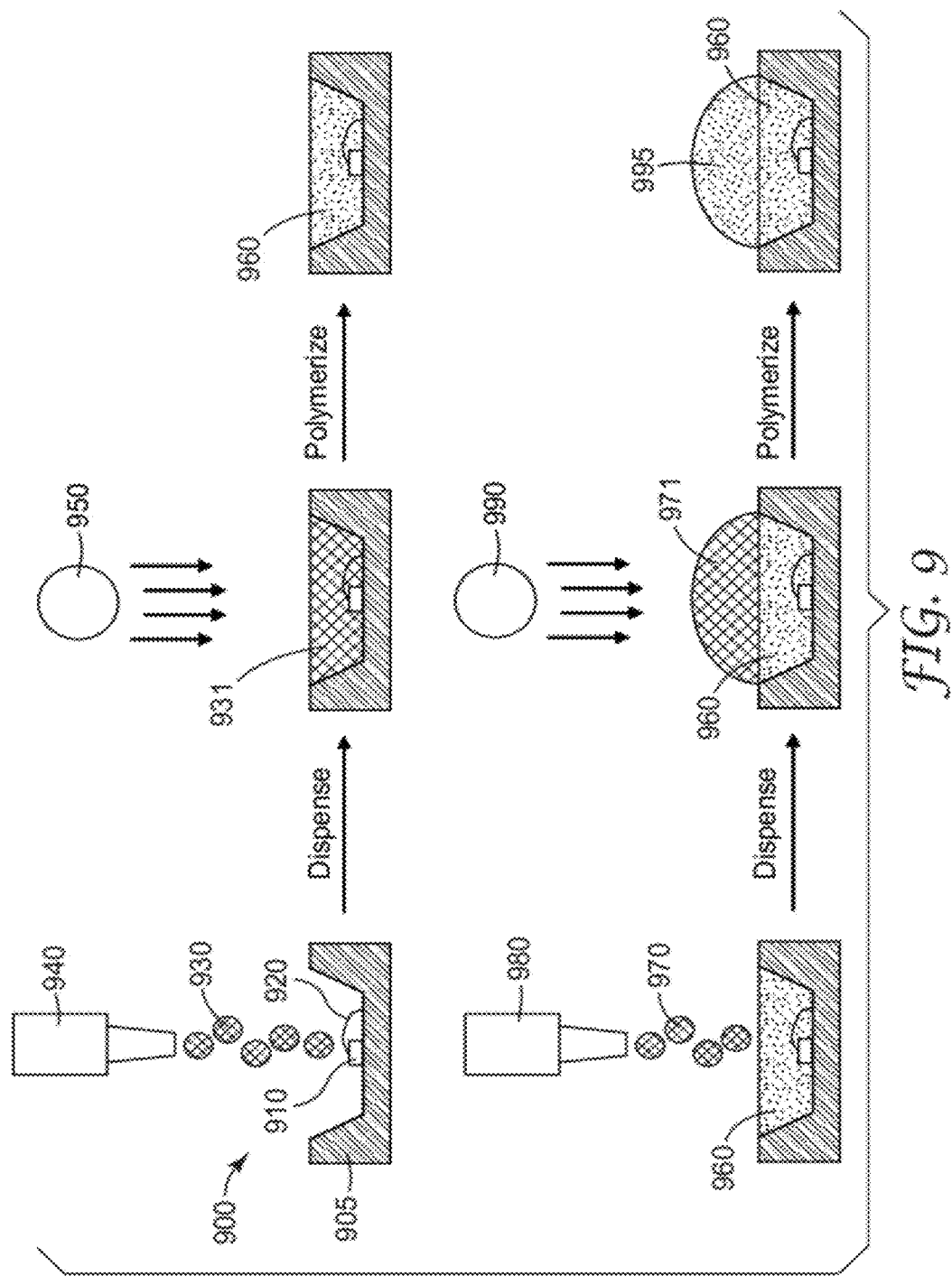

In FIG. 9, into unencapsulated LED device 900 having LED die 910 and wire bond 920 is added a plurality of drops of photopolymerizable composition 930 from dispensing device 940. The reflecting cup 905 is not overfilled with encapsulant 931. Irradiation of the composition with actinic radiation from light source 950 is then used to initiate polymerization and continues at least until the at least partially polymerized encapsulant 960 is formed. Onto the surface of the at least partially polymerized encapsulant is dispensed a second photopolymerizable composition 970 from dispensing device 980 to form a photopolymerizable dome lens 971. Photopolymerizable dome lens 971 is then irradiated with actinic radiation from light source 990 to at least partially polymerize the photopolymerizable dome lens 970 to make polymerized dome lens 995. For the final LED device, if the photopolymerizable compositions are the same or are nearly the same, the dome lens 995 is bonded to the encapsulant 960. In this case the encapsulant and the dome lens may be the same material or can be different materials.

In FIG. 10, LED die 1000 and wire bond 1010 are disposed on substrate 1020 which has been treated with an anti-wetting agent (wetting agent not shown) such that a circle or near circle is formed by the anti-wetting agent around the LED die and wire bond. The anti-wetting agent is designed to be anti-wetting for the photopolymerizable composition 1030 which is dispensed as one or more drops from dispensing device 1040. The photopolymerizable composition forms a photopolymerizable dome 1031, wherein the width of the dome where is meets the substrate is defined by the pattern of the anti-wetting agent. Irradiation with actinic radiation from light source 1050 is then used to initiate polymerization and continues at least until a partially polymerized domed encapsulant lens 1060 is formed, wherein the photopolymerizable composition has reached its gel point and the shape of the dome lens is set and no longer flows. Suitable anti-wetting agents are selected such that they adhere to the substrate on to which they are coated. The anti-wetting agent is chosen to prevent the photopolymerizable composition from spreading over the area of the substrate that has been treated with the anti-wetting agent. The anti-wetting agent can be applied to the substrate in a variety of ways including, but not limited to ink jetting or jet dispensing, contact printing, or screen printing.

FIGS. 11a and 11b show schematic diagrams of another exemplary LED device 1100 that can be formed using the method described herein. FIG. 11a shows a 3-D rendering of an LED device with a square geometry (details of the device are not shown). The dome lens on top of the 3D rendering of the LED device is shown in cross section and shows that the dome lens, where it contacts the top surface of the LED device, connects the two opposite corners of the square LED device. FIG. 11b shows the same LED device 1100 from an edge on view and shows that the dome lens also connects adjacent corners of the square LED device. These two figures in combination show that the dome lens in this case has taken on the shape of the top surface of the LED device, that is the lens is smoothly rounded at its top and the base of the lens (the surface of the lens that is in contact with the top surface of the LED device) takes on the shape of the LED device which in this figure is a square.

For LED devices where the photopolymerizable dome lens takes on the shape of the surface of the LED device, or LED device substrate, a wide variety of LED devices with unique lenses can be made where the shape of the lens is determined by the shape of the surface of the LED device or substrate. One example would be the LED device 1150 shown in FIGS. 11c and 11d, where the substrate is rectangular in shape. One dimension of the substrate is longer than the other dimension. In this case the dome lens extends in the long direction of the substrate such that it looks like a loaf of bread. This type of LED device may have more than one LED and may comprise and extend array of LEDs.

Figure 12:
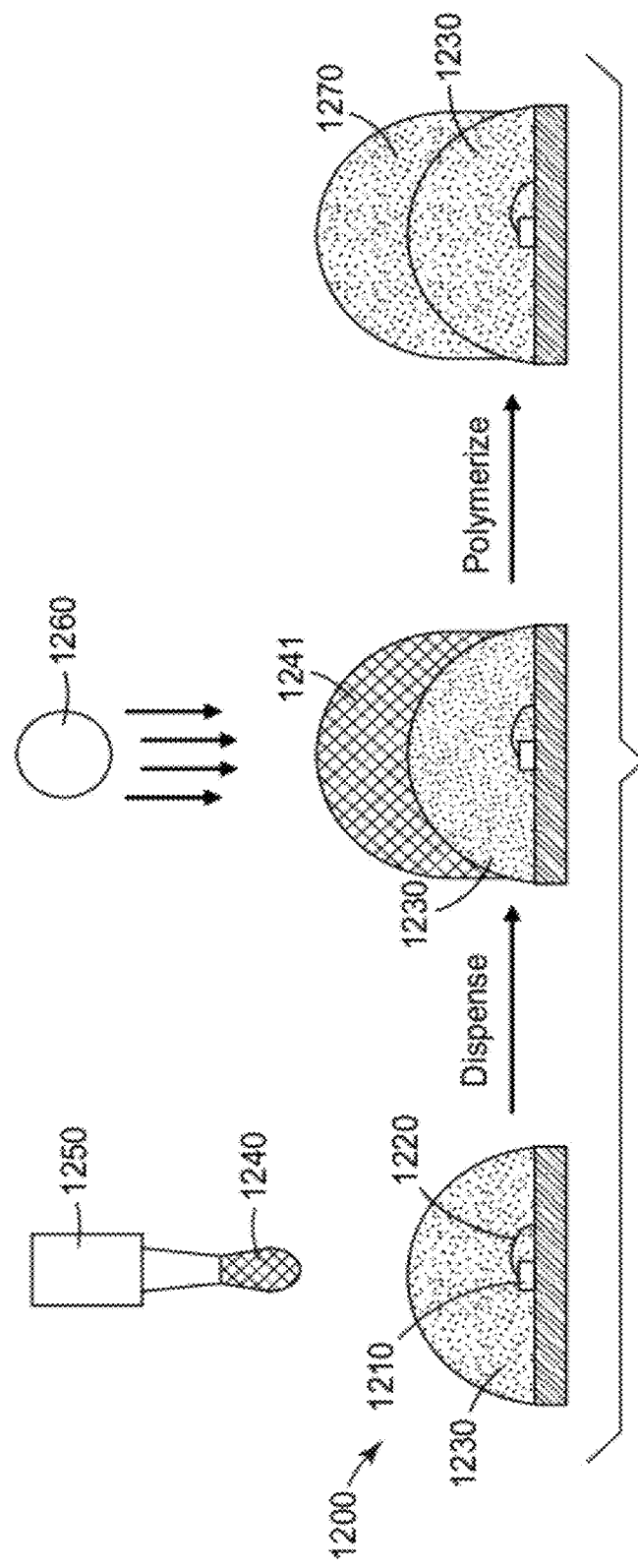
FIG. 12 is a schematic diagram illustrating an exemplary method of making an LED device according to an embodiment of the present disclosure.

In addition to providing dome lenses for the purpose of increasing the efficiency of LED devices, the addition of a dome lens can also be used to modify the emission distribution of an LED device. FIG. 12 shows a schematic flow diagram in cross section of an exemplary method used to make LED devices according to the present disclosure with collimating emission distributions. LED device 1200 has an LED die 1210 and wire bond 1220 which are encapsulated with a hemispherical encapsulant lens 1230. To the center of the hemispherical encapsulant lens surface is added a volume of photopolymerizable composition 1240 from dispensing device 1250, for example a syringe as described previously. That is, the optical element comprises a lens having a convex outer surface optically coupled to the LED die, and the photopolymerizable dome lens is formed on the convex outer surface.

The photopolymerizable composition forms photopolymerizable dome lens 1241 on top of encapsulant lens 1230. The photopolymerizable dome lens 1241 is then irradiated with actinic radiation from light source 1260 which initiates polymerization and continues at least until the photopolymerizable composition forms partially polymerized dome lens 1270 which is gelled and no longer flows. It is ideal that the dome lens 1270 is bonded to the encapsulant lens 1230. In this case the encapsulant lens and the dome lens may be the same material or can be different materials. The addition of the dome lens to the encapsulant lens provides an elongated lens which results in an LED device with a more collimated emission distribution.

Figure 13:
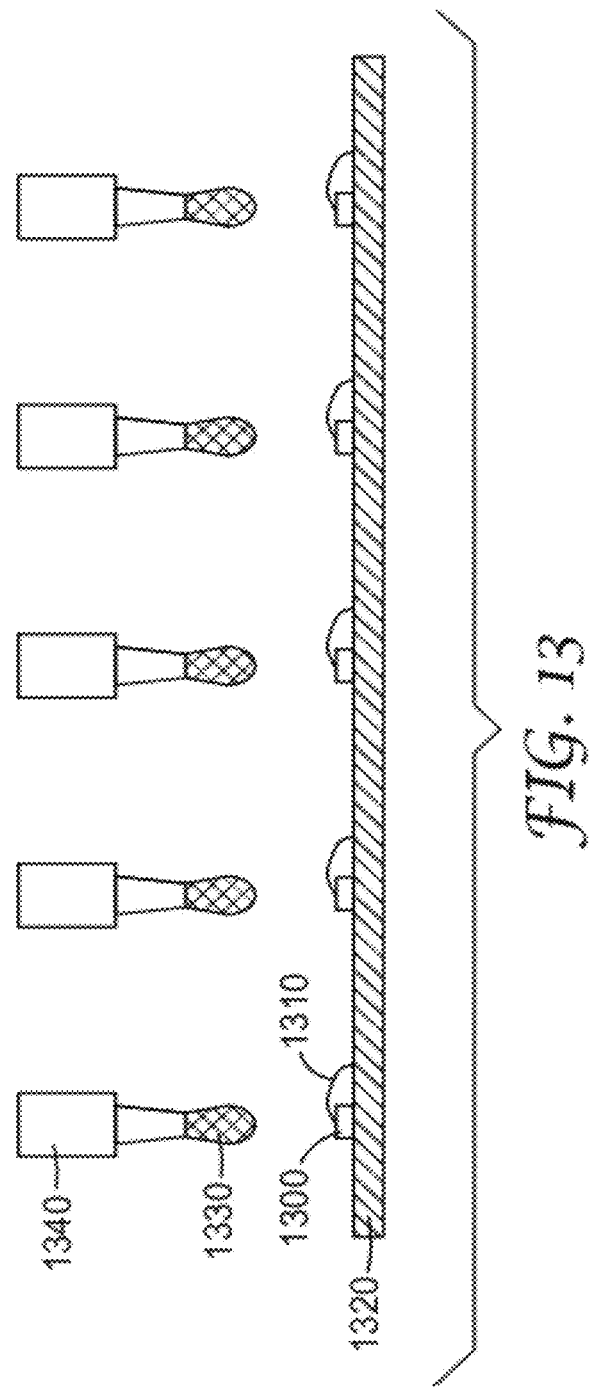
FIG. 13 is a schematic diagram illustrating an exemplary method of making an LED device according to an embodiment of the present disclosure.

FIG. 13 shows a schematic flow diagram of a method used to make LED devices according to the present disclosure. An array of LED die 1300 and wire bonds 1310 are disposed on substrate 1320. One or more drops of photopolymerizable composition 1330 is dispensed over each LED die simultaneously, nearly simultaneously, or at different times relative to each other. Dispensing device 1340 may comprise an array of dispensing syringes, multiple dispensing tips fed from a common reservoir, or multiple jetting heads. Each dispensing unit (syringes, dispensing tip, or jetting head) can have an integrated curing light source (not shown in FIG. 13), for example a fiber optic light source, which follows the dispensing device. Alternatively, the resulting photopolymerizable domes lens (not shown in FIG. 13) could be polymerized using a single light source that provides uniform light distribution over a large enough area. Parallel dispensing systems can be useful for decreasing the time required for dispensing thus increasing manufacturing productivity.

In its most basic form, an LED die is in the form of an individual component or chip made by semiconductor wafer processing procedures. The component or chip can include electrical contacts suitable for application of power to energize the device. The individual layers and other functional elements of the component or chip are typically formed on the wafer scale, the finished wafer finally being diced into individual piece parts to yield a multiplicity of LED dies.

Any LED die can be used in the method disclosed herein, i.e., LED emission light can be any light that an LED die can emit and can range from the UV to the infrared portions of the electromagnetic spectrum depending on the composition and structure of the semiconductor layers. Where the source of the actinic radiation is the LED itself, LED emission is desirably less or equal to 700 nm and preferably from about 350 to about 700 nm. The LED die may comprise more than one die. For example, with direct emissive LED devices, white light is generated by direct emission of different colored LED dies such as a combination of a red LED, a green LED, and a blue LED, or a combination of a blue LED and a yellow LED.

The LED can also include luminescent material that converts light emitted by the active region to other wavelengths. The luminescent material includes, for example, conventional phosphor particles, organic semiconductors, II-VI or III-V semiconductors, or II-VI or III-V quantum dots or nanocrystals, dies, or polymers. LED dies that generate light in a narrow range of wavelengths are also useful particularly in LED-excited phosphor-based light sources or PLEDs, wherein the light impinges upon and excites a phosphor material to produce visible light. The phosphor can comprise a mixture or combination of distinct phosphor materials, and the light emitted by the phosphor can include a plurality of narrow emission lines distributed over the visible wavelength range such that the emitted light appears substantially white to the unaided human eye. An example of a PLED is a blue LED illuminating a phosphor that converts blue to both red and green wavelengths. A portion of the blue excitation light is not absorbed by the phosphor, and the residual blue excitation light is combined with the red and green light emitted by the phosphor. Another example of a PLED is an ultraviolet (UV) LED illuminating a phosphor that absorbs and converts UV light to red, green, and blue light.

The LED die may be bonded disposed in the LED device such that it has a top wire bond or may be bonded in a flip-chip configuration. If there is more than one LED die, they may be arranged in arrays attached to a variety of substrates such as circuit boards, plastic electronic substrates and any other package that may have any shape.

In some embodiments, the LED die may be optically coupled to an optical element, for example, as described in U.S. Publ. No. 2007/0269586 (Leatherdale et al.) and references cited therein. For example, the optical element may comprise a material having a refractive index of about 1.75 or greater such as glass, diamond, silicone carbide, sapphire, zirconia, zinc oxide, polymer, or a combination thereof. Optical elements made from these materials are sometimes referred to as extractors or optical concentrators because they can be made into optical elements that aid extraction of light from the LED die to the surrounding medium as well as to modify the emission pattern of the light. The optical element may also comprise an extractor or optical concentrator, such as any of those described in the aforementioned reference and references cited therein.

The optical element and the LED may be attached to each other in just about any relative configuration as long as they are optically coupled and the resulting light emitting device functions as desired. For example, the LED die may be optically coupled to the photopolymerizable composition, and the LED die may be optically coupled to the optical element such that the photopolymerizable composition contacts the optical element.

In certain embodiments, previously described, the LED die may be encapsulated by an encapsulant prior to the application of the photopolymerizable composition. In this way, the properties of the encapsulant and the dome can be tuned individually with the appropriate selection of materials. For example, the encapsulant can be designed to protect the dome from high heat and light fluxes generated by the LED die. (LED die temperature can reach over 125° C.) The encapsulant can also be selected such that it is softer than the dome, or it can have lower modulus or viscosity relative to the dome. These properties can help reduce the amount of stress on the wire bond(s) during thermal cycling of the device such that damage to the wire bond(s) is minimized. The dome can be selected such that it provides a hard and/or tough outer surface that resists scratching and other types of physical defects that might otherwise affect the optical characteristics of light emitted by the device. The dome can also be selected so that it alleviates dust pick up issues common to current commercial encapsulants. Another advantage is that the encapsulant and dome can be chosen to increase the optical efficiency of the device, for example, if the refractive index of the encapsulant is greater than that of the dome.

The encapsulant may be a soft material, i.e., softer than the polymer that forms the dome. Soft materials include silicone gels or non-reactive or reactive liquids or gel materials that are photo and thermally stable and that exert little to no stress on the die and wire bond. The encapsulant can also be more elastomeric than the polymer that forms the dome. The encapsulant may comprise an organosiloxane-containing liquid, gel, elastomer, or a nonelastic solid. Preferred liquid materials are silicone gums, curing silicone fluids that build viscosity on irradiation, silicone gums made from low molecular weight fluids that cure and chain extend into gum like materials (i.e. no crosslinking) on irradiation with UV light, and curing silicone gels. The encapsulant may also comprise colorless soluble polyimides such as those described in U.S. Pat. No. 5,750,641, polyphosphazenes, epoxy, and acrylate compositions. In one embodiment, the encapsulant may comprises a silicone gel, silicone gum, silicone fluid, organosiloxane, organopolysiloxane, polysiloxane, sol-gel composition or combination thereof.

The invention may be more completely understood in consideration of the following examples.

EXAMPLES

Examples 1a-13a and Control-a

Fourteen Osram Advanced Power TOPLED LB G6SP blue LEDs (Osram Opto Semiconductors) were measured using an OL 770 Spectroradiometer (Optronics Laboratories, Inc., Orlando, Fla.) with a constant current of 70 mA. The Total Radiant Flux (TRF), Total Luminous Flux (TLF), and efficiency are for the LEDs are shown in Table 1. The devices had a dominant wavelength from 455 nm to 457 nm. One LED was designated as a Control-a LED and had a Total Radiant Flux (TRF) of 0.0415 Watts.

TABLE 1

| Ex. | TRF (W) | TLF (lumens) | Efficiency |
|---|---|---|---|
| Control-a | $4.15 \times 10^{-2}$ | | |
| 1a | $4.14 \times 10^{-2}$ | 2.67 | $1.91 \times 10^{-1}$ |
| 2a | $4.03 \times 10^{-2}$ | 2.84 | $1.84 \times 10^{-1}$ |
| 3a | $4.08 \times 10^{-2}$ | 2.77 | $1.89 \times 10^{-1}$ |
| 4a | $4.06 \times 10^{-2}$ | 2.73 | $1.88 \times 10^{-1}$ |
| 5a | $4.26 \times 10^{-2}$ | 2.76 | $1.99 \times 10^{-1}$ |
| 6a | $4.05 \times 10^{-2}$ | 2.91 | $1.87 \times 10^{-1}$ |
| 7a | $4.03 \times 10^{-2}$ | 2.74 | $1.85 \times 10^{-1}$ |
| 8a | $4.18 \times 10^{-2}$ | 2.82 | $1.92 \times 10^{-1}$ |
| 9a | $4.11 \times 10^{-2}$ | 2.70 | $1.90 \times 10^{-1}$ |
| 10a | $3.91 \times 10^{-2}$ | 2.50 | $1.85 \times 10^{-1}$ |
| 11a | $4.08 \times 10^{-2}$ | 2.64 | $1.92 \times 10^{-1}$ |
| 12a | $4.03 \times 10^{-2}$ | 2.65 | $1.87 \times 10^{-1}$ |
| 13a | $3.95 \times 10^{-2}$ | 2.71 | $1.80 \times 10^{-1}$ |

Preparation of Photocurable Silicone Encapsulant

Under safe light conditions, 50 g of each Part A and Part B of 3M™ photocurable silicone encapsulant, PSE-002 (lot#1G6P, available from 3M Company, St. Paul, Minn.) was added to a small glass jar. The silicone was mixed thoroughly using a steel stirring rod and then was degassed under vacuum to remove all air bubbles from the silicone resin. The degassed resin was transferred into a 5 mL black opaque syringe (available from EFD, Inc., East Providence, R.I.) for use with an EFD manually controlled air driven syringe dispensing system (model 1500XL, EFD, Inc., East Providence, R.I.). The syringe tip used for dispensing was an 18 gauge polypropylene tip (product number 5118PPS-B, available from EFD, Inc.). The PSE-002 resin is a non-thixotropic silicone resin and has a viscosity at 25° C. of approximately 4400 cP.

Examples 1b-13b

Figure 14B:
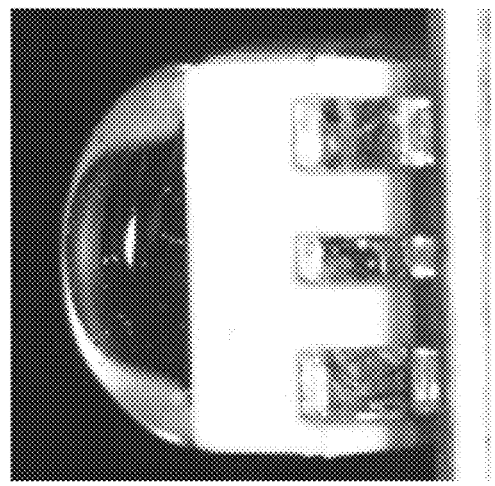
FIGS. 14a and 14b are before and after micrographs, respectively, of LED devices according to embodiments of the present disclosure.
Figure 14A:
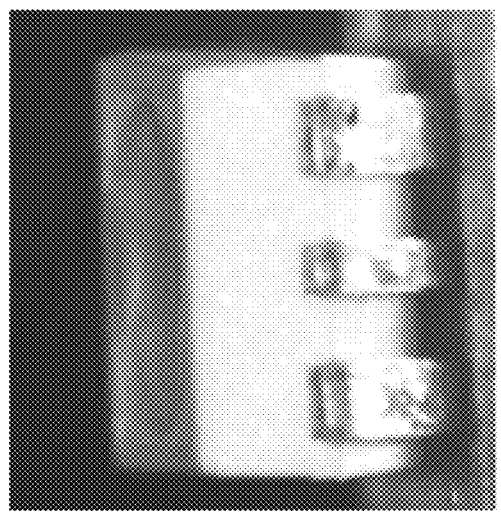

For each of the LEDs of Examples 1a-13a, approximately 12 mg of the Photocurable Silicone Encapsulant was placed in contact with the surface of the encapsulant of the LED to form a dome of uncured resin. The LEDs with domed uncured resins were cured to give corresponding Examples 1b-13b. Curing was carried out by exposure to light with a wavelength of between 300 and 400 nm for 30 seconds from a Super Spot Max Fiber Optic Light source (available from LESCO, Torrance, Calif.) at a distance of 2 cm. The intensity of the light was ~1 W/cm² at the surface of the PSE-002. The resulting cured lenses were elastomeric and cured as determined by probing with the tip of a tweezer. FIG. 14a shows a side view of an example of one of the LEDs prior to adding the PSE-002 dome lens and FIG. 14b shows a side view of the same LED after adding the PSE-002 dome lens and curing with light.

Examples 1b-13b and Control-a were measured with the OL-770 spectroradiometer (Optronics Laboratories, Inc.) and the results are shown in Table 2. The average increase in efficiency for the thirteen LEDs was 26.9%.

TABLE 2

| Ex. | TRF (W) | TLF (lumens) | Efficiency | TRF +(%) | TLF +(%) | Efficiency +(%) |
|---|---|---|---|---|---|---|
| Control a | $4.15 \times 10^{-2}$ | | | NA | NA | NA |
| 1b | $5.27 \times 10^{-2}$ | 3.27 | $2.44 \times 10^{-1}$ | 27.35 | 22.76 | 27.67 |
| 2b | $5.09 \times 10^{-2}$ | 3.45 | $2.31 \times 10^{-1}$ | 26.31 | 21.58 | 26.01 |
| 3b | $5.16 \times 10^{-2}$ | 3.36 | $2.39 \times 10^{-1}$ | 26.49 | 21.24 | 26.35 |
| 4b | $5.16 \times 10^{-2}$ | 3.33 | $2.38 \times 10^{-1}$ | 27.00 | 21.94 | 27.08 |

TABLE 2-continued

| Ex. | TRF (W) | TLF (lumens) | Efficiency | TRF +(%) | TLF +(%) | Efficiency +(%) |
|---|---|---|---|---|---|---|
| 5b | $5.41 \times 10^{-2}$ | 3.36 | $2.53 \times 10^{-1}$ | 27.00 | 21.74 | 27.28 |
| 6b | $5.09 \times 10^{-2}$ | 3.54 | $2.35 \times 10^{-1}$ | 25.93 | 21.71 | 25.80 |
| 7b | $5.11 \times 10^{-2}$ | 3.34 | $2.34 \times 10^{-1}$ | 26.76 | 21.69 | 26.68 |
| 8b | $5.28 \times 10^{-2}$ | 3.42 | $2.42 \times 10^{-1}$ | 26.19 | 21.23 | 26.10 |
| 9b | $5.23 \times 10^{-2}$ | 3.28 | $2.39 \times 10^{-1}$ | 27.01 | 21.74 | 26.27 |
| 10b | $4.94 \times 10^{-2}$ | 3.03 | $2.36 \times 10^{-1}$ | 26.57 | 21.27 | 27.48 |
| 11b | $5.22 \times 10^{-2}$ | 3.22 | $2.45 \times 10^{-1}$ | 28.03 | 22.11 | 27.54 |
| 12b | $5.15 \times 10^{-2}$ | 3.24 | $2.41 \times 10^{-1}$ | 27.87 | 22.35 | 28.85 |
| 13b | $5.01 \times 10^{-2}$ | 3.30 | $2.31 \times 10^{-1}$ | 27.01 | 21.80 | 28.62 |
| | | | Average | 26.69 | 21.63 | 26.86 |
| | | | St. Dev. | 0.94 | 0.70 | 1.19 |

Example 2

Figure 15A:
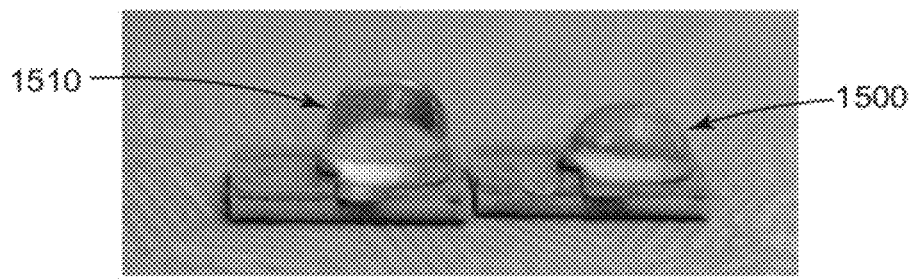
FIGS. 15a and 15b are before and after micrographs, respectively, of LED devices according to embodiments of the present disclosure.
Figure 15B:
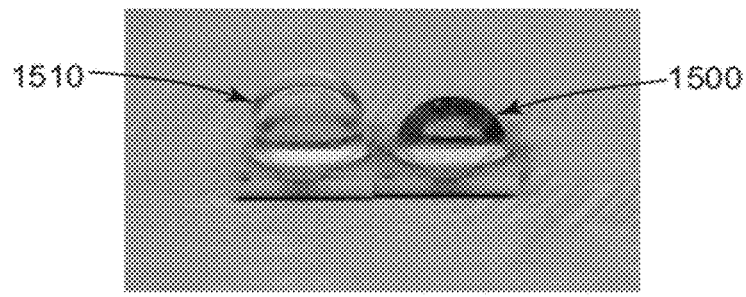

Approximately 0.5 mg of Photocurable Silicone Encapsulant (PSE-002 was placed in contact with the top of the encapsulant lens of a Luxeon™ Rebel white LED (Part No. LXML-PWC1-0100) to form a dome of uncured resin on top of the encapsulant lens (shown in FIG. 12). The LED with photopolymerizable domed silicone (PSE-002) was polymerized to give a "jelly bean" like lens over the LED die. Polymerization was initiated by exposure to light with a wavelength of between 300 and 400 nm for 30 seconds from a Super Spot Max Fiber Optic Light source (available from LESCO, Torrance, Calif.) at a distance of 2 cm. The intensity of the light was ~1 W/cm² at the surface of the photopolymerizable silicone (PSE-002). The gel time for the photopolymerizable composition under these curing conditions was less than 5 seconds. The resulting cured lenses were elastomeric and were determined to be cured by probing with the tip of a tweezers. FIG. 15a shows a micrograph with side perspective view of the LED prior to adding the dome lens 1500 and the LED with the dome lens 1510. FIG. 15b shows a micrograph of the same LEDs with an end perspective view.

Figure 16:
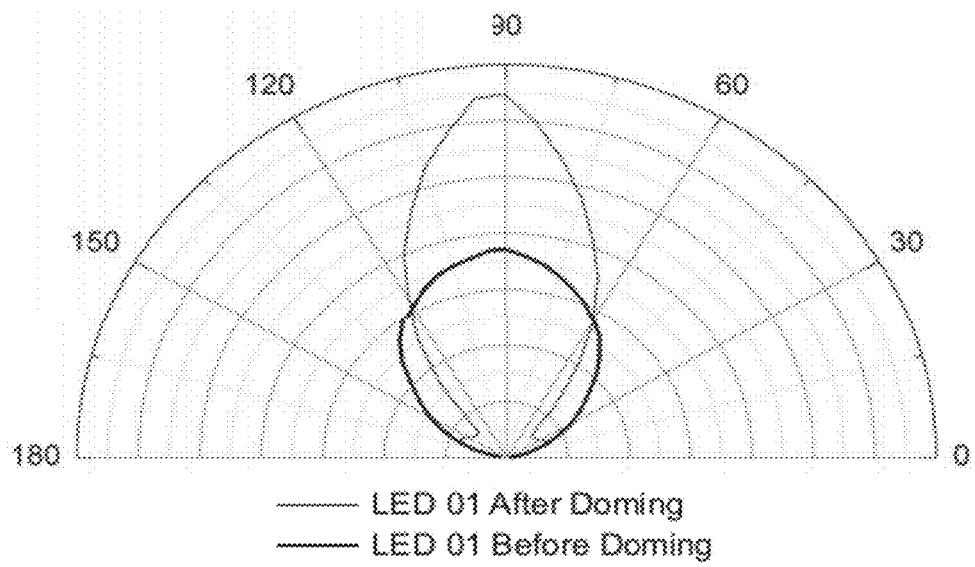
FIG. 16 is a goniometric plot showing the emission distribution for the LED devices shown in FIG. 15a and FIG. 15b.

Goniometric scans of the emission distribution were taken before and after applying the dome lens to the Luxeon LED device using a goniometer attached to an OL-770 spectroradiometer. The results of the goniometric scans are shown in FIG. 16. The viewing angle or half angle for the LED prior to applying the dome lens was ~52 degrees. The viewing angle or half angle for the LED after applying the dome lens was ~25 degrees. The LED with dome lens added has a more collimated emission distribution. The viewing angle is the off-axis angle from the lamp center line where the luminous intensity is one half the value of the on-axis peak value.

What is claimed is:
1. A light emitting device, comprising:
an LED die;
a dome lens encapsulating the LED die against a substantially planar surface, the dome lens having a first outer curved surface; and
a photopolymerizable composition disposed on the dome lens, the photopolymerizable composition forming a meniscus lens defined by a second outer curved surface and an inner curved surface, the inner curved surface being in contact with only a portion of the first outer curved surface and allowing a substantially circumferential outer portion of the dome lens to be exposed intermediate the meniscus lens and the substantially planar surface;
wherein an edge of an outer surface of the meniscus lens is substantially flush, forming a smooth curvature, with an outer surface of the dome lens, such that the dome lens and the meniscus lens in combination form a continuous elongated dome lens; and
wherein the photopolymerizable composition contacts no component of the light emitting device other than the dome lens.

2. The device of claim 1, wherein the dome lens is made of a different material than the photopolymerizable composition.

3. The device of claim 1, wherein the photopolymerizable composition comprises a metal-containing catalyst and a silicon-containing resin comprising silicon-bonded hydrogen and aliphatic unsaturation.

4. The device of claim 3, wherein the silicon-containing resin comprises a first organosiloxane having units of the formula:

wherein:
$R^i$ is a monovalent, straight-chained, branched or cyclic, unsubstituted or substituted, hydrocarbon group that is free of aliphatic unsaturation and has from 1 to 18 carbon atoms;
a is 0, 1, 2, or 3;
c is 0, 1, or 2; and
the sum of a+c is 0, 1, 2, or 3;
with the proviso that there is on average at least one silicon-bonded hydrogen present per molecule.

5. The device of claim 1, wherein the photopolymerizable composition is substantially Newtonian and has a viscosity of from about 100 to about 15,000 cP at 25° C.

6. The device of claim 1, further comprising a substrate on which the LED die is disposed.

7. A light emitting device, comprising:
an LED die;
a dome lens encapsulating the LED die against a substantially planar surface, the dome lens having a first outer curved surface; and
a photopolymerized material disposed on the dome lens, the photopolymerized material forming a meniscus lens defined by a second outer curved surface and an inner curved surface, the inner curved surface being in contact with only a portion of the first outer curved surface and allowing a substantially circumferential outer portion of the dome lens to be exposed intermediate the meniscus lens and the substantially planar surface;
wherein an edge of an outer surface of the meniscus lens is substantially flush, forming a smooth curvature, with an outer surface of the dome lens, such that the dome lens and the meniscus lens in combination form a continuous elongated dome lens; and
wherein the photopolymerized material contacts no component of the light emitting device other than the dome lens.

8. The device of claim 7, wherein the dome lens is made of a different material than the photopolymerized material.

9. The device of claim 7, wherein the photopolymerized material comprises an elastomer.

10. The device of claim 7, wherein the photopolymerized material comprises a non-elastic solid.

11. The device of claim 7, further comprising a substrate on which the LED die is disposed.

12. A light emitting device, comprising:
an LED die disposed on a support structure;
a dome lens encapsulating the LED die against a substantially planar top surface of the support structure, the dome lens contacting the support structure and having a first outer curved surface; and
a photopolymerized material disposed on the dome lens, the photopolymerized material forming a meniscus lens defined by a second outer curved surface and an inner curved surface;
wherein the photopolymerized material contacts the dome lens along the inner curved surface without contacting the support structure and wherein a substantially circumferential outer portion of the dome lens is exposed intermediate the meniscus lens and the substantially planar top surface;
wherein an edge of an outer surface of the meniscus lens is substantially flush, forming a smooth curvature, with an outer surface of the dome lens, such that the dome lens and the meniscus lens in combination form a continuous elongated dome lens; and
wherein the photopolymerized material contacts no component of the light emitting device other than the dome lens.

13. The device of claim 12, wherein the dome lens is made of a different material than the photopolymerized material.

14. The device of claim 12, wherein the photopolymerized material comprises an elastomer.

15. The device of claim 12, wherein the photopolymerized material comprises a non-elastic solid.

* * * * *